(12) United States Patent
Kim et al.

(10) Patent No.: US 10,270,007 B2
(45) Date of Patent: Apr. 23, 2019

(54) LIGHT EMITTING DIODE, METHOD FOR MANUFACTURING THE SAME, AND LIGHT EMITTING DEVICE MODULE HAVING THE SAME

(71) Applicant: Seoul Viosys Co., Ltd., Ansan-si (KR)

(72) Inventors: Jae Kwon Kim, Ansan-si (KR); Ho Seob Noh, Ansan-si (KR); Jong Kyu Kim, Ansan-si (KR); Min Woo Kang, Ansan-si (KR); Hyun A Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/867,148

(22) Filed: Jan. 10, 2018

(65) Prior Publication Data

US 2018/0145224 A1 May 24, 2018

Related U.S. Application Data

(63) Continuation of application No. PCT/KR2016/006923, filed on Jun. 29, 2016.

(30) Foreign Application Priority Data

Jul. 10, 2015 (KR) .......................... 10-2015-0098612
Nov. 19, 2015 (KR) .......................... 10-2015-0162518
Jun. 27, 2016 (KR) .......................... 10-2016-0080406

(51) Int. Cl.
*H01L 33/38* (2010.01)
*H01L 33/24* (2010.01)
(Continued)

(52) U.S. Cl.
CPC .......... *H01L 33/38* (2013.01); *H01L 33/0075* (2013.01); *H01L 33/06* (2013.01);
(Continued)

(58) Field of Classification Search
CPC ....... H01L 33/38; H01L 33/405; H01L 33/24; H01L 33/06; H01L 33/32; H01L 33/46; H01L 33/502
See application file for complete search history.

(56) References Cited

U.S. PATENT DOCUMENTS 8,664,635 B2 * 3/2014 Jung ...................... H01L 33/505
257/13
8,835,961 B2 * 9/2014 Kraus ...................... H01L 33/44
257/98
(Continued)

FOREIGN PATENT DOCUMENTS

JP 2013-236049 11/2013
KR 10-2011-0126435 11/2011
(Continued)

OTHER PUBLICATIONS

International Search Report dated Sep. 28, 2016, issued in International Application No. PCT/KR2016/006923.

*Primary Examiner* — William Coleman
(74) *Attorney, Agent, or Firm* — H.C. Park & Associates, PLC

(57) ABSTRACT

A light emitting diode having improved light efficiency and enhanced reflectivity of a device by forming an insulating reflective part on a reflective electrode formed on the upper surface of a mesa. A mesa exposing part is formed on the outer periphery and/or in the interior region of the reflective electrode to expose a predetermined area of the upper surface of the mesa such that reflection at the mesa exposing part is performed by the insulating reflective part.

38 Claims, 33 Drawing Sheets

(51) Int. Cl.
*H01L 33/32* (2010.01)
*H01L 33/40* (2010.01)
*H01L 33/46* (2010.01)
*H01L 33/50* (2010.01)
*H01L 33/62* (2010.01)
*H01L 33/00* (2010.01)
*H01L 33/06* (2010.01)
*F21S 45/48* (2018.01)
*G02F 1/1335* (2006.01)
*F21V 8/00* (2006.01)
*F21S 41/141* (2018.01)
*F21Y 115/10* (2016.01)
*F21S 45/43* (2018.01)

(52) U.S. Cl.
CPC .............. *H01L 33/24* (2013.01); *H01L 33/32* (2013.01); *H01L 33/405* (2013.01); *H01L 33/46* (2013.01); *H01L 33/502* (2013.01); *H01L 33/62* (2013.01); *F21S 41/141* (2018.01); *F21S 45/43* (2018.01); *F21S 45/48* (2018.01); *F21Y 2115/10* (2016.08); *G02B 6/0073* (2013.01); *G02F 1/133603* (2013.01); *H01L 33/382* (2013.01); *H01L 2933/0016* (2013.01); *H01L 2933/0025* (2013.01); *H01L 2933/0066* (2013.01)

(56) References Cited

U.S. PATENT DOCUMENTS

| | | | | |
|---|---|---|---|---|
| 9,236,526 | B2* | 1/2016 | Choi | H01L 33/10 |
| 9,666,764 | B2* | 5/2017 | Bergmann | H01L 33/0079 |
| 9,780,268 | B2* | 10/2017 | Hussell | H01L 33/62 |
| 2011/0278634 | A1 | 11/2011 | Na et al. | |
| 2013/0292718 | A1 | 11/2013 | Chu et al. | |
| 2014/0124821 | A1* | 5/2014 | Tomonari | H01L 33/38 257/99 |
| 2017/0125641 | A1* | 5/2017 | Jeon | H01L 33/382 |

FOREIGN PATENT DOCUMENTS

| | | |
|---|---|---|
| KR | 10-2014-0121802 | 10/2014 |
| KR | 10-2015-0004139 | 1/2015 |
| KR | 10-2015-0071630 | 6/2015 |

* cited by examiner

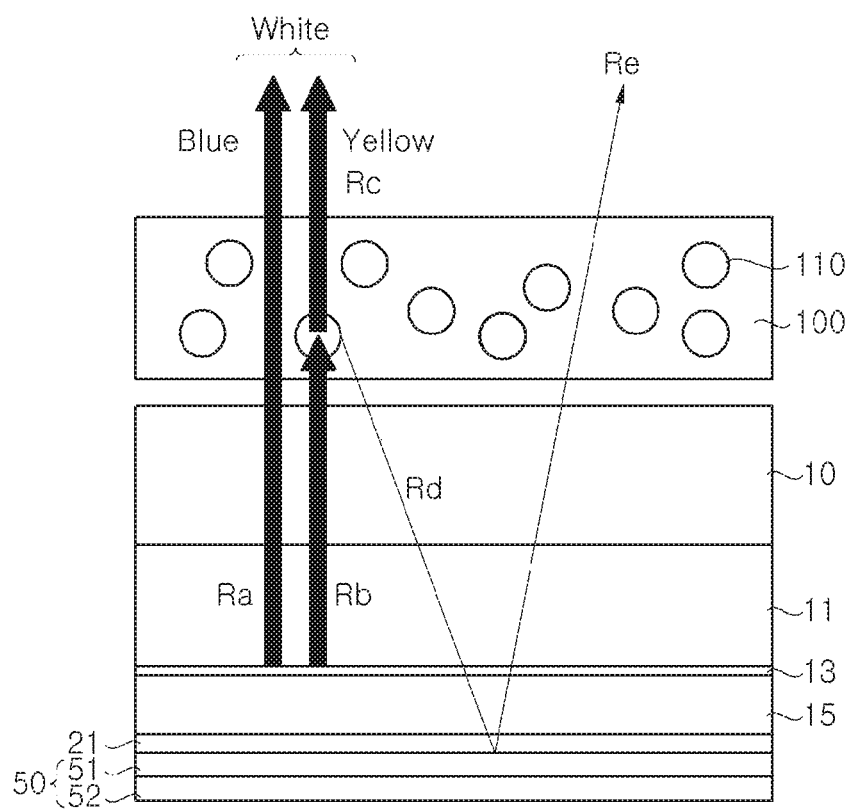

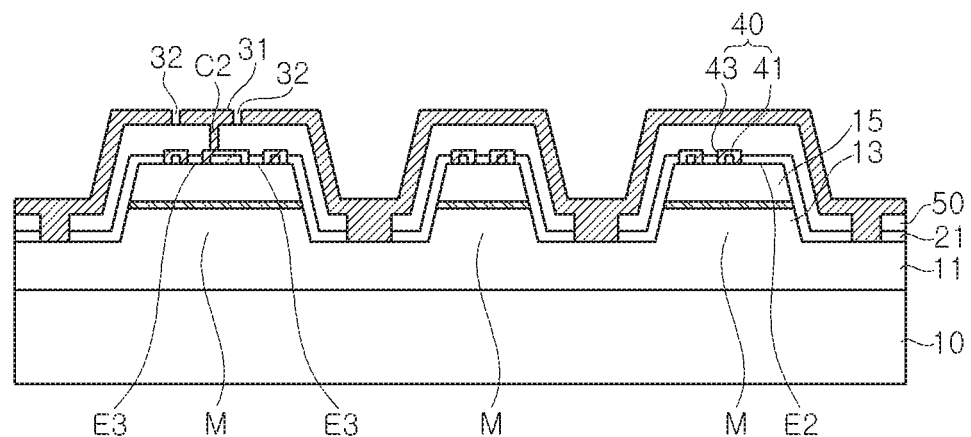
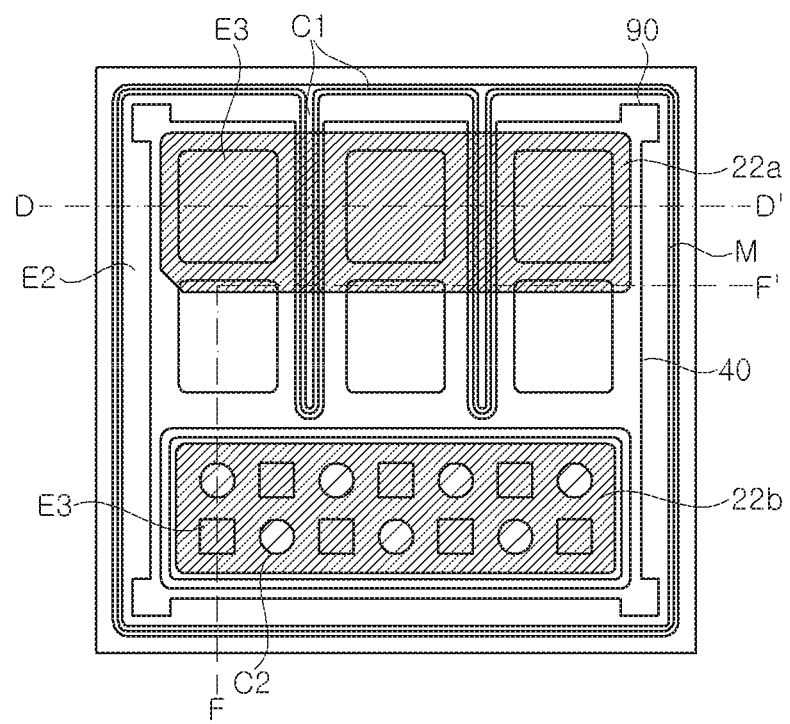

LIGHT EMITTING DIODE, METHOD FOR MANUFACTURING THE SAME, AND LIGHT EMITTING DEVICE MODULE HAVING THE SAME

CROSS-REFERENCE TO RELATED APPLICATION

This application is a Bypass Continuation of International Patent Application No. PCT/KR2016/006923, filed on Jun. 29, 2016, and claims priority to and the benefit of Korean Patent Application No. 10-2015-0098612, filed on Jul. 10, 2015, Korean Patent Application No. 10-2015-0162518, filed on Nov. 19, 2015, and Korean Patent Application No. 10-2016-0080406, filed on Jun. 27, 2016, all of which are incorporated by reference for all purposes as if fully set forth herein.

BACKGROUND

Field

Exemplary embodiments of the present disclosure relate to a light emitting diode, a method of manufacturing the same, and a light emitting device module including the same, and more particularly, to a light emitting diode having improved reflectance, a method of manufacturing the same, and a light emitting device module including the same.

Discussion of the Background

Gallium nitride (GaN) light emitting diodes (LEDs) have been applied to various fields, such as natural color LED display devices, LED traffic signals, white LEDs, and the like.

A light emitting diode refers to a device that emits light through recombination of electrons and holes in an active layer. The active layer is provided at opposite sides thereof with a p-type semiconductor layer and an n-type semiconductor layer, respectively, such that electrons and holes injected into the active layer are recombined therein to generate light upon application of voltage to an interface between the p-type semiconductor layer and the n-type semiconductor layer.

A flip-chip light emitting diode (LED) has a structure wherein light generated from the active layer is emitted through a transparent substrate, and is generally configured to reflect light towards the transparent substrate using an electrode formed on the p-type semiconductor layer or the n-type semiconductor layer as a reflective electrode. Particularly, various electrode structures have been suggested in order to assist in current spreading in a large flip-chip light emitting diode while improving light output.

However, since there is a limit in improvement of reflectance of a material for the reflective electrode, an increase in the area of the reflective electrode can be taken into account in order to improve luminous efficacy of the light emitting diode. For example, when an electrode formed on the p-type semiconductor layer is used as the reflective electrode, an upper surface of the p-type semiconductor layer, that is, an upper surface of a mesa structure, is increased as much as possible in view of improvement in luminous efficacy.

However, a decrease in distance between the reflective electrode and the periphery of an upper surface of the mesa structure causes an increase in the possibility of current leakage and has a limitation in improvement of luminous efficacy.

In order to improve light output in the flip chip structure, a technique of reducing light loss by disposing a distributed Bragg reflector on a side on which electrodes are formed can be considered. The distributed Bragg reflector (DBR) is formed by alternating layers having different indices of refraction and generally provides high reflectance over a broad range of wavelengths. In general, a DBR composed of 20 pairs of layers is used to provide high reflectance over a wide wavelength range of 400 nm to 700 nm. However, such a DBR has a large thickness of about 4 µm, making it difficult to perform patterning, and a large side inclination of the DBR makes it difficult to form an electrode on the DBR.

On the other hand, light emitting diodes are modularized into a light emitting device module when used in a final product. In general, the light emitting diodes have been fabricated into a package through a packaging process and then mounted on a printed circuit board. Recently, however, a technique for fabricating a light emitting device module using the light emitting diodes directly mounted on the printed circuit board without the packaging process is used in the art.

The above information disclosed in this Background section is only for enhancement of understanding of the background of the invention and, therefore, it may contain information that does not constitute prior art.

SUMMARY

Exemplary embodiments of the present disclosure provide a light emitting diode having good current spreading performance.

Exemplary embodiments of the present disclosure provide a light emitting diode having improved reflectance and a method of manufacturing the same. Specifically, the present disclosure is aimed at increasing reflectance of a reflective electrode having a decreased area instead of increasing the area of the reflective electrode.

Exemplary embodiments of the present disclosure provide a light emitting diode that includes an insulating reflection layer allowing easy patterning while maintaining high light reflectivity.

Exemplary embodiments of the present disclosure provide a light emitting diode capable of preventing degradation of current spreading performance resulting from decrease in area of the reflective electrode.

Exemplary embodiments of the present disclosure provide a light emitting diode that can prevent degradation of the light emitting diode in a manufacturing process while improving luminous efficacy of a light emitting diode package.

Exemplary embodiments of the present disclosure provide a light emitting diode that can prevent breakage of an electrode to improve reliability.

Exemplary embodiments of the present disclosure provide a light emitting device module that can be manufactured without a packaging process.

Additional features of the invention will be set forth in the description which follows, and in part will be apparent from the description, or may be learned by practice of the invention.

An exemplary embodiment of the present disclosure provides a light emitting diode including: at least one mesa structure in which a first conductivity type semiconductor layer, an active layer and a second conductivity type semiconductor layer are sequentially stacked, the mesa structure being partially removed by etching to expose at least part of the first conductivity type semiconductor layer; a first electrode electrically connected to the exposed first conductivity type semiconductor layer; and a second electrode formed on an upper surface of the mesa structure and electrically connected to the second conductivity type semiconductor layer, wherein a mesa exposing portion is formed in at least some region of a periphery of the upper surface of the mesa structure, the mesa exposing portion being not covered by the second electrode and exposing the second conductivity type semiconductor layer, the mesa exposing portion including a first mesa exposing portion having a first separation distance between the second electrode and the periphery of the upper surface of the mesa structure and a second mesa exposing portion having a second separation distance therebetween; the second separation distance is greater than the first separation distance; and an insulating reflection portion is formed at least on the second mesa exposing portion.

The mesa exposing portion may further include a third mesa exposing portion formed on the upper surface of the mesa structure and surrounded by the second electrode.

The insulating reflection portion may have a stacked structure of a first insulating reflection portion for reflecting light in a relatively long wavelength range and a second insulating reflection portion for reflecting light in a relatively short wavelength range, and a lower insulation layer may be formed under the insulating reflection portion.

The lower insulation layer may include a first opening and a second opening, and the first electrode and the second electrode may be formed on the first opening and the second opening, respectively. Here, the first opening and the second opening may be formed by different processes.

The mesa exposing portion may be formed in at least some region of a periphery of the light emitting diode and the first separation distance may be a distance between the periphery of the upper surface of the mesa and a reflective electrode-enlarged portion in which the second electrode is enlarged. The reflective electrode-enlarged portion may be formed near a vertex of the light emitting diode and the second separation distance may be 20 μm or more.

The light emitting diode may further include a first pad and a second pad electrically connecting the first electrode and the second electrode to an external power source, respectively.

The first pad and the second pad may be electrically connected to the first electrode and the second electrode through a first contact portion and a second contact portion, respectively, and the second contact portion may have a larger area than the first contact portion.

The light emitting diode may further include a second electrode connection pad electrically connected to the second electrode, wherein the first electrode may be electrically insulated from the second electrode connection pad by an upper insulation layer. The first electrode and the second electrode connection pad may be formed by the same process.

An exemplary embodiment of the present disclosure provides a light emitting diode package including the light emitting diode described above, the package further including a wavelength conversion layer converting wavelengths of light having passed through the substrate. In the light emitting diode package, the light emitting diode is a blue light emitting diode and the wavelength conversion layer may include at least one of blue, green and red phosphors.

An exemplary embodiment of the present disclosure provides a light emitting diode package including: a light emitting diode and a wavelength conversion layer, wherein the light emitting diode includes a reflective electrode reflecting light generated from an active layer towards a transparent substrate and an insulating reflection portion formed in a region of an upper surface of a mesa not covered by the reflective electrode; the insulating reflection portion includes a first insulating reflection portion for reflecting light subjected to wavelength conversion by the wavelength conversion layer and a second insulating reflection portion for reflecting light generated from the active layer; and the light subjected to wavelength conversion by the wavelength conversion layer has a longer wavelength than the light generated from the active layer.

The first insulating reflection portion may be formed closer to the transparent substrate than the second insulating reflection portion.

An exemplary embodiment of the present disclosure provides a light emitting diode including: a lower semiconductor layer; an upper semiconductor layer disposed on the lower semiconductor layer; an active layer interposed between the lower semiconductor layer and the upper semiconductor layer; a first opening formed through the upper semiconductor layer and the active layer to expose the lower semiconductor layer; a reflective insulation layer covering the upper semiconductor layer and the lower semiconductor layer and having a second opening formed inside the first opening to define a first contact region of the lower semiconductor layer; and a first electrode layer disposed on the reflective insulation layer and connected to the first contact region of the lower semiconductor layer, wherein the reflective insulation layer has a stacked structure in which a first material layer having a first index of refraction and a second material layer having a second index of refraction are alternately stacked one above another; the first contact region is placed on a bottom surface of the first opening; and an angle θ of a sidewall of the second opening with respect to the lower semiconductor layer satisfies the following Equation 1, in which h indicates a thickness of the reflective insulation layer and a indicates a length of the bottom surface of the first opening from the first contact region to the sidewall of the first opening.

$$\tan^{-1}(2h/a) \leq \theta \leq 55°. \quad \text{(Equation 1)}$$

When θ is less than or equal to 55°, the light emitting diode can prevent breakage of the first electrode layer formed on the reflective insulation layer. In addition, when θ is greater than or equal to tan−1 (2 h/a), the light emitting diode can reduce the amount of light traveling towards a side surface of the reflective insulation layer, thereby securing reflectivity of the reflective insulation layer.

The length (a) of the bottom surface of the first opening from the first contact region to the sidewall of the first opening may range from 1.5 μm to 10 μm, and the thickness (t) of the reflective insulation layer may range from 1 μm to 2.5 μm. With the structure wherein the reflective insulation layer has a thickness h of 1 μm or more, the light emitting diode can secure reflectance of the reflective insulation layer. In addition, with the structure wherein the reflective insulation layer has a thickness h of 2.5 μm or less, patterning of the reflective insulation layer can be easily performed and a side inclination of the reflective insulation layer can be easily controlled. Specifically, the length (a) may range from 2 μm to 6 μm, and the thickness (h) may range from 1.5 μm to 2.5 μm, more specifically 1.5 μm to 2 μm.

In addition, the reflective insulation layer may include 8 to 11 pairs of the first material layers and the second material layers.

In one exemplary embodiment, the first material layer may be a $SiO_2$ layer and the second material layer may be a $TiO_2$ layer. For example, the $SiO_2$ layer may have an index of refraction of about 1.47 and the $TiO_2$ layer may have an index of refraction of about 2.4 to about 2.7.

The first material layer may have a higher index of refraction than the second material layer, and may form the uppermost layer and the lowermost layer of the reflective insulation layer. Specifically, each of the lowermost layer and the uppermost layer of the reflective insulation layer may be a SiO₂ layer. In addition, the lowermost layer or the uppermost layer of the reflective insulation layer may have a larger thickness than other first material layers.

The second opening may have an elongated shape. In addition, one distal end of the second opening may have a round shape with an enlarged width. With the structure wherein the one distal end of the second opening has a round shape with a greater width than other portions thereof, it is possible to prevent formation of a severe inclination on the sidewall of the second opening upon patterning of the reflective insulation layer through lithography and etching.

In some exemplary embodiments, the light emitting diode includes a mesa including the upper semiconductor layer and the active layer, wherein a second contact region is disposed around the mesa along a periphery of the first conductivity type semiconductor layer and the first electrode layer extends around the mesa to be connected to the second contact region. With this structure, the second contact region is surrounded by the mesa to assist in current spreading.

In some exemplary embodiments, the first contact region may extend from the second contact region. In addition, a plurality of first contact regions may extend from the second contact region. These first contact regions may be arranged parallel to each other.

The light emitting diode may further include a second electrode layer disposed on the reflective insulation layer. The reflective insulation layer may further include at least one third opening disposed on the upper semiconductor layer and the second electrode layer may be electrically connected to the upper semiconductor layer through the third opening.

In some exemplary embodiments, the light emitting diode may further include a conductive layer interposed between the upper semiconductor layer and the reflective insulation layer to contact the upper semiconductor layer, wherein the conductive layer may be exposed through the third opening and the second electrode layer may be connected to the conductive layer through the third opening.

The light emitting diode may further include an upper insulation layer disposed on the first electrode layer and the second electrode layer, wherein the upper insulation layer may have openings exposing the first electrode layer and the second electrode layer to define a first electrode pad region and a second electrode pad region. Accordingly, the first electrode layer and the second electrode layer can act as electrode pads and formation of separate electrode pads is not required, thereby simplifying a process of manufacturing the light emitting diode.

Each of the first electrode layer and the second electrode layer may include a Ti layer adjoining the upper insulation layer. With the Ti layer disposed as the uppermost layer of the first electrode layer and the second electrode layer, adhesion of the upper insulation layer can be improved.

The second electrode layer may be formed of the same material as the first electrode layer. Furthermore, the first electrode layer and the second electrode layer may be formed by the same process. Furthermore, the second electrode layer may be surrounded by the first electrode layer.

Each of the first electrode layer and the second electrode layer may include an ohmic contact layer, a metal reflection layer, an anti-diffusion layer, and an anti-oxidation layer. Thus, the first electrode layer and the second electrode layer can be directly bonded to a printed circuit board via solder pastes.

The light emitting diode may further include a substrate disposed under the lower semiconductor layer. The substrate may be a growth substrate used for growth of the lower semiconductor layer, the active layer and the upper semiconductor layer. Light generated from the active layer may be discharged through the substrate.

An exemplary embodiment of the present disclosure provides a light emitting diode including: a lower semiconductor layer; a mesa disposed on the lower semiconductor layer and including an upper semiconductor layer and an active layer; a reflective insulation layer covering the mesa and the lower semiconductor layer around the mesa while exposing a periphery of the lower semiconductor layer; and a first electrode layer disposed on the reflective insulation layer and contacting the periphery of the lower semiconductor layer around the mesa, wherein the reflective insulation layer has a stacked structure in which a first material layer having a first index of refraction and a second material layer having a second index of refraction are alternately stacked one above another; and an angle θ of a side surface of the reflective insulation layer with respect to the lower semiconductor layer satisfies the following Equation 1, in which h indicates a thickness of the reflective insulation layer and a indicates a distance from a contact region between the first electrode layer and the periphery of the lower semiconductor layer to a sidewall of the mesa.

$$\tan^{-1}(2h/a) \leq \theta \leq 55°. \qquad \text{(Equation 1)}$$

Within this range of angle θ of the side surface of the reflective insulation layer to the lower semiconductor layer, the light emitting diode can prevent breakage of the first electrode layer while securing reflectivity of the reflective insulation layer.

Furthermore, the distance (a) from the contact region between the first electrode layer and the periphery of the lower semiconductor layer to the sidewall of the mesa may range from 1.5 μm to 10 μm, and the thickness (t) of the reflective insulation layer may range from 1 μm to 2.5 μm. With the structure wherein the reflective insulation layer has a thickness h of 1 μm or more, the light emitting diode can secure reflectance of the reflective insulation layer. In addition, with the structure wherein the reflective insulation layer has a thickness h of 2.5 μm or less, patterning of the reflective insulation layer can be easily performed and a side inclination of the reflective insulation layer can be easily controlled. Specifically, the length (a) may range from 2 μm to 6 μm, and the thickness (h) may range from 1.5 μm to 2.5 μm, more specifically 1.5 μm to 2 μm.

In addition, the reflective insulation layer may include 8 to 11 pairs of the first material layers and the second material layers. With this structure, the reflective insulation layer can exhibit good reflectance and patterning of the reflective insulation layer can be easily performed.

An exemplary embodiment of the present disclosure provides a light emitting device module including: a printed circuit board; the light emitting diode described above; and a solder paste bonding the light emitting diode to the printed circuit board, wherein the solder paste is connected to the first electrode layer. Since the light emitting diode is directly mounted on the printed circuit board via the solder paste, a packaging process can be omitted, thereby providing a light emitting device module through a simple manufacturing process.

Exemplary embodiments of the present disclosure provide a light emitting diode, in which a second mesa exposing portion is formed in a region of a periphery of a mesa to have a relatively great separation distance between a reflective electrode and the periphery of an upper surface of the mesa and an insulating reflection portion is formed on the second mesa exposing portion in order to improve reflectance while reducing the area of the reflective electrode.

In addition, exemplary embodiments of the present disclosure provide a light emitting diode, in which a reflective electrode-enlarged portion is formed in at least some region of the periphery of the light emitting diode, for example, at a vertex of the light emitting diode to prevent degradation in current spreading performance due to decrease in area of the reflective electrode.

Further, exemplary embodiments of the present disclosure provide a light emitting diode, in which an insulating reflection portion is formed on a lower insulation layer to prevent damage to the light emitting diode due to ionic damage during formation of the insulating reflection portion.

Further, exemplary embodiments of the present disclosure provide a light emitting diode package, in which a first insulating reflection portion for reflecting light having a relatively long wavelength and a second insulating reflection portion for reflecting light having a relatively short wavelength are sequentially formed to improve luminous efficacy.

Further, exemplary embodiments of the present disclosure provide a light emitting diode that includes a reflective insulation layer having a side inclination of 55 degrees or less with respect to a lower semiconductor layer to prevent breakage of a first electrode layer formed thereon. In addition, the side inclination is set to be $\tan^{-1}(2\,h/a)$ or more to prevent deterioration in reflectivity of the reflective insulation layer.

It is to be understood that both the foregoing general description and the following detailed description are exemplary and explanatory and are intended to provide further explanation of the invention as claimed.

BRIEF DESCRIPTION OF THE DRAWINGS

The above and other aspects, features and advantages of the present invention will be more clearly understood from the following detailed description taken in conjunction with the accompanying drawings, in which:

FIG. 1A and FIG. 1B show a light emitting diode according to one exemplary embodiment of the present disclosure, in which FIG. 1A is a plan view and FIG. 1B is a cross-sectional view taken along line A-A' in FIG. 1A.

FIG. 2 is a conceptual view of a light emitting diode package including a light emitting diode and a wavelength conversion layer according to exemplary embodiments of the present disclosure.

FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, and FIG. 9B are views illustrating a method of manufacturing the light emitting diode shown in FIG. 1, in which FIGS. 3A, 4A, 5A, 6A, 7A, 8A, and 9A are plan views and FIGS. 3B, 4B, 5B, 6B, 7B, 8B, and 9B are cross-sectional views taken along line A-A' in FIGS. 3A, 4A, 5A, 6A, 7A, 8A, and 9A, respectively.

FIG. 10A and FIG. 10B show a light emitting diode according to another exemplary embodiment of the present disclosure, in which FIG. 10A is a plan view and FIG. 10B is a cross-sectional view taken along line B-B' in FIG. 10A.

FIG. 12A, FIG. 12B, and FIG. 12C shows a light emitting diode according to a further exemplary embodiment of the present disclosure, in which FIG. 12A is a plan view, FIG. 12B is a cross-sectional view taken along line D-D' in FIG. 12A, and FIG. 12C is a cross-sectional view taken along line E-E' in FIG. 12A.

FIG. 13A and FIG. 13B are views illustrating a method of manufacturing the light emitting diode shown in FIGS. 12A-12C, in which FIG. 13A is a plan view and FIG. 13B is a cross-sectional view taken along line D-D' in FIG. 13A.

FIG. 14A and FIG. 14B are views illustrating a method of manufacturing the light emitting diode shown in FIGS. 12A-12C, in which FIG. 14A is a plan view and FIG. 14B is a cross-sectional view taken along line D-D' in FIG. 14A.

FIG. 15A, FIG. 15B, FIG. 15C, FIG. 16A, FIG. 16B, FIG. 16C, FIG. 17A, FIG. 17B, FIG. 17C, FIG. 18A, FIG. 18B, and FIG. 18C are views illustrating a method of manufacturing the light emitting diode shown in FIGS. 12A-12C, in which FIGS. 15A, 16A, 17A, and 18A are plan views, FIGS. 15B, 16B, 17B, and 18B are cross-sectional view taken along line D-D' in each of FIGS. 15A, 16A, 17A, and 18A, respectively, and FIGS. 15C, 16C, 17C, and 18C are cross-sectional view taken along line F-F' in each of FIGS. 15A, 16A, 17A, and 18A, respectively.

DETAILED DESCRIPTION OF THE ILLUSTRATED EMBODIMENTS

Figure 1A:
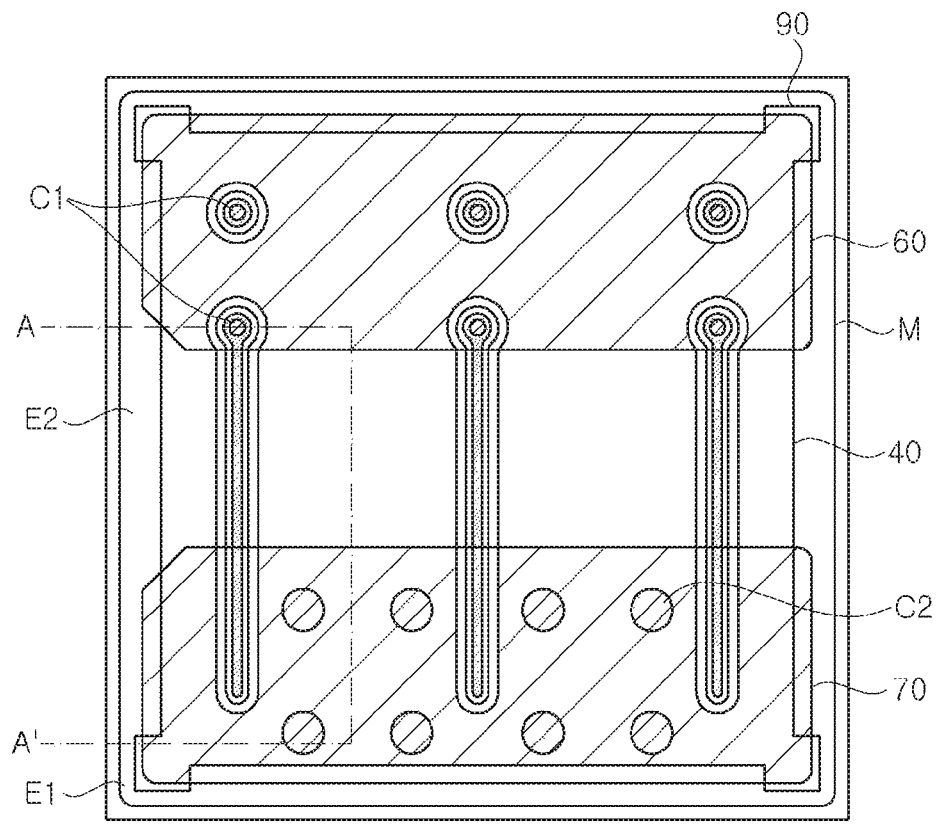

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
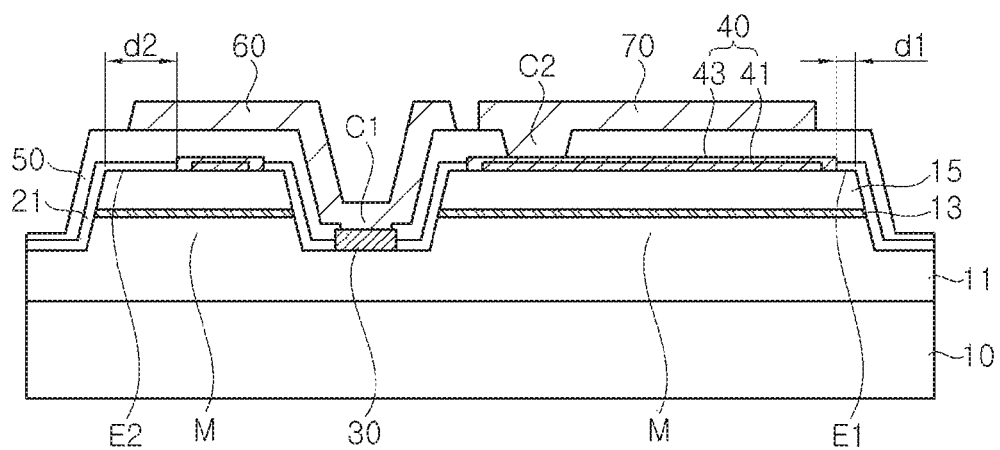

FIG. 1A is a plan view of a light emitting diode according to one exemplary embodiment of the present disclosure and FIG. 1B is a cross-sectional view taken along line A-A' in FIG. 1A. Referring to FIGS. 1A and 1B, the light emitting diode according to the exemplary embodiment includes a plurality of mesa structures M formed by sequentially stacking a first conductivity type semiconductor layer 11, an active layer 13, and a second conductivity type semiconductor layer 15 on a substrate 10, followed by mesa etching.

Although the substrate 10 can be formed of any typical material used in the art, the substrate 10 is a transparent substrate to allow light generated from the active layer 13 to be discharged through the substrate 10. The substrate 10 may be selected from sapphire ($Al_2O_3$), silicon carbide (SiC), gallium nitride (GaN), aluminum nitride (AlN), indium gallium nitride (InGaN), aluminum gallium nitride (AlGaN), and gallium oxide ($Ga_2O_3$) substrates.

The first conductivity type semiconductor layer 11 may be a nitride semiconductor layer doped with n-type dopants. For example, the first conductivity type semiconductor layer 11 may be an $Al_xIn_yGa_zN$ (0≤x, y, z≤1, x+y+z=1) semiconductor layer doped with n-type dopants, which may include at least one of Si, Ge, Sn, Se and Te. The second conductivity type semiconductor layer 15 may be a nitride semiconductor layer doped with p-type dopants. For example, the second conductivity type semiconductor layer 15 may be an $Al_xIn_yGa_zN$ (0≤x, y, z≤1, x+y+z=1) semiconductor layer doped with p-type dopants, which may include at least one of Mg, Zn, Ca, Sr, Be and Ba. The active layer 13 generates light through recombination of electrons and holes injected into the first conductivity type semiconductor layer 11 and the second conductivity type semiconductor layer 15, respectively, and may include Group III-V compound materials, for example, $Al_xIn_yGa_zN$ (0≤x, y, z≤1, x+y+z=1). The active layer 13 may have a single quantum well (SQW) or multi-quantum well (MQW) structure. For example, the active layer 13 may have a single quantum well structure of an InGaN or AlGaN layer, or a multi-quantum well structure having a multilayer structure of InGaN/GaN, AlGaN/(In)GaN, or InAlGaN/(In)GaN.

The stacked structure of the first conductivity type semiconductor layer 11, the active layer 13 and the second conductivity type semiconductor layer 15 is subjected to mesa etching to expose the first conductivity type semiconductor layer 11 in some regions of the light emitting diode, and a lower insulation layer 21 is formed on an upper surface thereof. The lower insulation layer 21 may be a silicon dioxide ($SiO_2$) layer and have a thickness of about 100 nm. As shown in FIG. 1B, the lower insulation layer 21 is removed in some regions thereof, in which first electrodes 30 and a second electrode 40 will be formed, such that the first conductivity type semiconductor layer 11 and the second conductivity type semiconductor layer 15 are exposed therethrough.

The first electrode 30 is formed in an exposed region of the first conductivity type semiconductor layer 11, which is formed by removing the lower insulation layer 21. As shown in FIG. 1A, the first electrode 30 may be composed of a plurality of first electrodes, which have a circular shape and a linear shape and are uniformly arranged to secure uniform current spreading performance of the light emitting diode. Although six first electrodes 30 having a circular shape and a linear shape are illustrated in FIG. 1A, the shape, number and arrangement of the first electrodes may be modified in various ways without being limited thereto. The first electrodes 30 may be formed of aluminum (Al) and may have a multilayer structure which includes a bonding layer of titanium (Ti), chromium (Cr), nickel (Ni) or the like or a protective layer of nickel (Ni), chromium (Cr), gold (Au) or the like at a upper or lower side thereof. The first electrode 30 electrically connects the first conductivity type semiconductor layer 11 to an external power source through a first pad 60 described below.

The second electrode 40 is formed on the upper surface of the mesa structure from which the lower insulation layer 21 is removed, that is, on an upper surface of the second conductivity type semiconductor layer 15. The second electrode 40 is a reflective electrode that reflects light generated from the active layer 13 towards the substrate 10 and thus may include a reflective conductive layer 41 formed of silver (Ag) or silver alloys. The reflective conductive layer 41 may further include a barrier layer 43 to prevent diffusion of materials. The barrier layer 43 may be formed of W, TiW, Mo, Cr, Ni, Pt, Rh, Pd, Ti, or alloys thereof, or may be a composite layer thereof, and may be formed to surround an upper surface and a side surface of the reflective conductive layer 41, as shown in FIG. 1(b). The second electrode 40 may further include a bonding layer of Ni, NiZn, ITO, ZnO, or the like, which is formed on a surface adjoining the second conductivity type semiconductor layer 15 to form ohmic contact with the second conductivity type semiconductor layer 15. The second electrode 40 serves not only to reflect light but also to electrically connect the second conductivity type semiconductor layer 15 to an external power source through a second pad 70 described below.

As shown in FIG. 1A and FIG. 1B, the second electrode 40 is formed only on the upper surface of the mesa structure and is separated a predetermined distance from the periphery of the upper surface of the mesa structure in order to prevent current leakage, and mesa exposing portions E1, E2 are formed in a separation region not covered by the second electrode 40 such that the upper surface of the mesa structure can be exposed to the mesa exposing portions.

In the light emitting diode according to this exemplary embodiment, the separation region between the second electrode 40 and the periphery of the upper surface of the mesa structure does not have a constant distance and may include a first mesa exposing portion E1 having a relatively small separation distance d1 and a second mesa exposing portion E2 having a relatively large separation distance d2. The separation distance d1 of the first mesa exposing portion E1 may be the shortest distance from the second electrode 40 to the periphery of the upper surface of the mesa structure and may be 3 μm or more in order to prevent current leakage. On the other hand, the separation distance d2 of the second mesa exposing portion E2 may be 20 μm or more.

Referring to FIG. 1A, the second mesa exposing portion E2 may be formed in at least some regions between the second electrode 40 and the periphery of the light emitting diode, for example, between the second electrode 40 and four sides of the light emitting diode. If the separation distance between the second electrode 40 and the periphery of the upper surface of the mesa structure is large, there can be a problem of degradation in current spreading performance in the second conductivity type semiconductor layer 15. Thus, the separation distance between the second electrode 40 and the periphery of the upper surface of the mesa structure may be less than d2 in some regions. For example, a reflective electrode-enlarged portion 90 is formed near each of four vertices of the light emitting diode by enlarging the second electrode such that the separation distance between the reflective electrode-enlarged portion 90 and the periphery of the mesa structure becomes d1. Although FIG. 1B shows only the first mesa exposing portion and the second mesa exposing portion, the light emitting diode may further include a third mesa exposing portion having a separation distance d3 between the second electrode 40 and the periphery of the upper surface of the mesa structure. Here, separation distance d3 may be the same as or different from separation distance d1 or separation distance d2.

An insulating reflection portion 50 is formed on the lower insulation layer 21 and the first and second electrodes 30, 40. The insulating reflection portion 50 may be a distributed Bragg reflector (DBR) and may have a multilayer structure in which layers having different indices of refraction are alternately stacked one above, for example, $SiO_2/TiO_2$ or $SiO_2/Nb_2O_5$. Wavelengths of light reflected by the insulating reflection portion 50 can be adjusted by adjusting optical thicknesses of insulation layers stacked therein. For example, if the light emitting diode according to this exemplary embodiment is a blue light emitting diode, the optical thicknesses of the insulation layers stacked in the insulating reflection portion 50 can be adjusted to secure good reflection characteristics with respect to light in the blue wavelength range.

The insulating reflection portion 50 may include a first insulating reflection portion and a second insulating reflection portion, in which the first insulating reflection portion reflects light having longer wavelengths than the second insulating reflection portion. For example, the first insulating reflection portion may be an insulating reflection portion for reflecting yellow light and the second insulating reflection portion may be an insulating reflection portion for reflecting blue light. In this exemplary embodiment, the insulating reflection portion 50 may have a structure wherein the first insulating reflection portion is deposited on the lower insulation layer 21 and the second insulating reflection portion is deposited on the first insulating reflection portion. In addition, the insulating reflection portion 50 may further include a third insulating reflection portion having a different reflection wavelength range than the first and second insulating reflection portions.

The insulating reflection portion 50 is formed with a first contact portion C1 and a second contact portion C2, and a first pad 60 and a second pad 70 are formed on the first and second contact portions, respectively. The first pad 60 and the second pad 70 are electrically connected to the first electrode 30 and the second electrode 40 through the first contact portion C1 and the second contact portion C2, respectively. The first pad 60 and the second pad 70 may be used as pads for connection of bumps or for surface-mount technology (SMT) to mount the light emitting diode on a submount, a package or a printed circuit board.

In the light emitting diode according to the exemplary embodiment described above, light generated from the active layer 13 is reflected by the second electrode 40 and is then discharged through the substrate 10. Further, in the mesa exposing portions E1, E2 on the side surface or upper surface of the mesa structure not covered by the second electrode 40, light is reflected by the insulating reflection portion 50 and discharged through the substrate 10. Since the second electrode including the reflective conductive layer 41 formed of silver (Ag) or the like generally has a reflectance of at most 90% to 94%, whereas the insulating reflection portion 50 acting as a distributed Bragg reflector has a reflectance of about 99%, the light emitting diode according to this exemplary embodiment has improved luminous efficacy.

Particularly, according to this exemplary embodiment, the second mesa exposing portion E2 having a longer separation distance between the second electrode 40 and the periphery of the upper surface of the mesa structure than the first mesa exposing portion E1 is formed, for example, in at least some regions between the second electrode 40 and four sides of the light emitting diode, thereby increasing the ratio of light reflected by the insulating reflection portion 50 while improving luminous efficacy. In a structure wherein the second mesa exposing portion E2 is formed at all of the four sides of the light emitting diode, current spreading performance in the second conductive semiconductor layer can be deteriorated at corners of the light emitting diode. In this exemplary embodiment, for example, the reflective electrode-enlarged portion 90 is formed near the four vertices of the light emitting diode by enlarging the second electrode 40, thereby preventing deterioration in current spreading performance due to formation of the second mesa exposing portion E2.

Further, as the insulating reflection portion 50, the light emitting diode according to this exemplary embodiment employs the stacked structure of the first insulating reflection portion for reflecting light having a relatively long wavelength and the second insulating reflection portion for reflecting light having a relatively short wavelength, thereby further improving luminous efficacy of a light emitting diode package including the light emitting diode according to the exemplary embodiment and a wavelength conversion layer. This will be described with reference to FIG. 2.

FIG. 2 is a conceptual view of a light emitting diode package including a wavelength conversion layer 100 and the light emitting diode according to the exemplary embodiment of the present disclosure, in which only the mesa exposing portions E1, E2 are shown for description of reflection by the insulating reflection portion 50. The light emitting diode may be a blue light emitting diode and the wavelength conversion layer 100 may include yellow phosphor particles. As shown in FIG. 2, among components of blue light generated from the active layer 13, Ra passes through the substrate 10 and the wavelength conversion layer 100 to be emitted to the outside and Rb excites the yellow phosphor particles 110 while passing through the wavelength conversion layer 100 such that yellow light Rc can be emitted from the wavelength conversion layer 100. Thus, the light emitting diode package emits white light through mixing of blue light and yellow light.

Some fractions Rd of yellow light emitted from the yellow phosphor particles 110 excited by blue light are directed towards the light emitting diode and enter the insulating reflection portion 50 through the substrate 10 and the first and second conductivity type semiconductor layers 11, 15. However, since the insulating reflection portion 50 has the structure wherein the first insulating reflection portion 51 for reflecting light having a relatively long wavelength is deposited on the lower insulation layer 21, the fractions Rd of the yellow light are effectively reflected by the first insulating reflection portion 51 to be discharged to the outside when reaching the first insulating reflection portion 51.

In a structure wherein the second insulating reflection portion 52 for reflecting light having a relatively short wavelength is deposited on the lower insulation layer 21, the fractions Rd of the yellow light must be reflected by the first insulating reflection portion 51 after passing through the second insulating reflection portion 52, and then discharged to the outside after passing through the second insulating reflection portion 52 again. However, since attenuation of light occurs while yellow light having a long wavelength passes through the second insulating reflection portion 52 configured to reflect light having a short wavelength, this structure can suffer from deterioration in luminous efficacy, as compared with the structure according to the exemplary embodiments. Thus, the light emitting diode according to the exemplary embodiment employs the insulating reflection portion 50 formed by sequentially stacking the first insulating reflection portion 51 for reflecting light having a relatively long wavelength and the second insulating reflection portion 52 for reflecting light having a relatively short wavelength, and is coupled to the wavelength conversion layer 100, thereby securing better luminous efficacy of the light emitting diode package.

Although the wavelength conversion layer 100 is illustrated as including the yellow phosphor particles 110 in FIG.

2, the wavelength conversion layer 100 may include other types of phosphor particles that emit light having a longer wavelength through absorption of light emitted from the active layer 13. For example, when the active layer 13 is configured to emit blue light, the phosphor particles 110 may include at least one of yellow, green, and red phosphor particles.

In addition, when the wavelength conversion layer 100 includes two or more types of phosphor particles 110, for example, green and red phosphor particles, the insulating reflection portion 50 may have a stacked structure of insulating reflection portions corresponding to wavelength ranges of green and red light, respectively. Here, an insulating reflection portion for reflecting light having a relatively long wavelength range may be stacked as the lowermost layer of the stacked structure.

Next, a method of manufacturing the light emitting diode according to the exemplary embodiment shown in FIG. 1 will be described with reference to FIGS. 3A, 3B, 4A, 4B, 5A, 5B, 6A, 6B, 7A, 7B, 8A, 8B, 9A, and 9B. FIGS. 3A, 4A, 5A, 6A, 7A, 8A, and 9A are plan views and FIGS. 3B, 4B, 5B, 6B, 7B, 8B, and 9B are cross-sectional views taken along line A-A' in FIGS. 3A, 4A, 5A, 6A, 7A, 8A, and 9A, respectively. Here, it should be understood that implementations of the present disclosure are not limited to the light emitting diode manufactured by a particular manufacturing method and the manufacturing method described below is provided for illustration and understanding of the structure of light emitting diodes according to exemplary embodiments of the present disclosure.

Figure 3A:
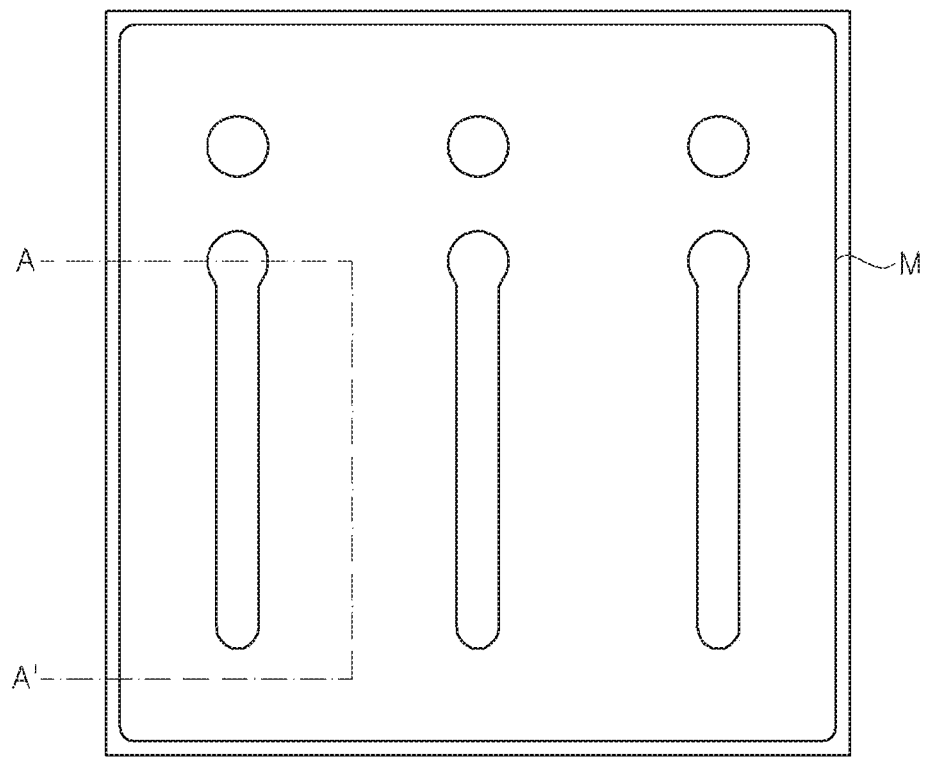
Figure 3B:
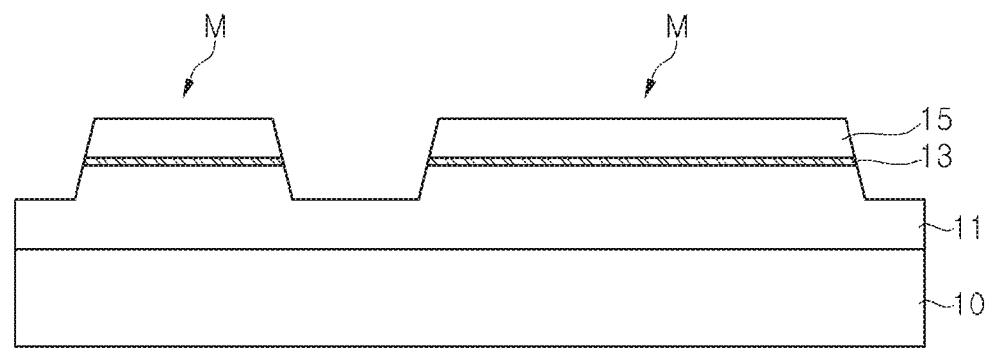

FIGS. 3A and 3B show a process of forming the mesa structure, in which the first conductivity type semiconductor layer 11, the active layer 13 and the second conductivity type semiconductor layer 15 are sequentially deposited on the substrate 10. Each of the semiconductor layers may be formed by metal organic chemical vapor deposition (MOCVD) or molecular beam epitaxy (MBE). Next, with a photoresist pattern (not shown) formed on the second conductivity type semiconductor layer 15, the mesa structure is formed by etching the second conductivity type semiconductor layer 15 and the active layer 13 using the photoresist pattern as a mask so as to expose the first conductivity type semiconductor layer 11. A side surface of the mesa structure may be formed at a predetermined inclination in order to improve light extraction efficiency through photoresist reflow or the like.

Figure 4A:
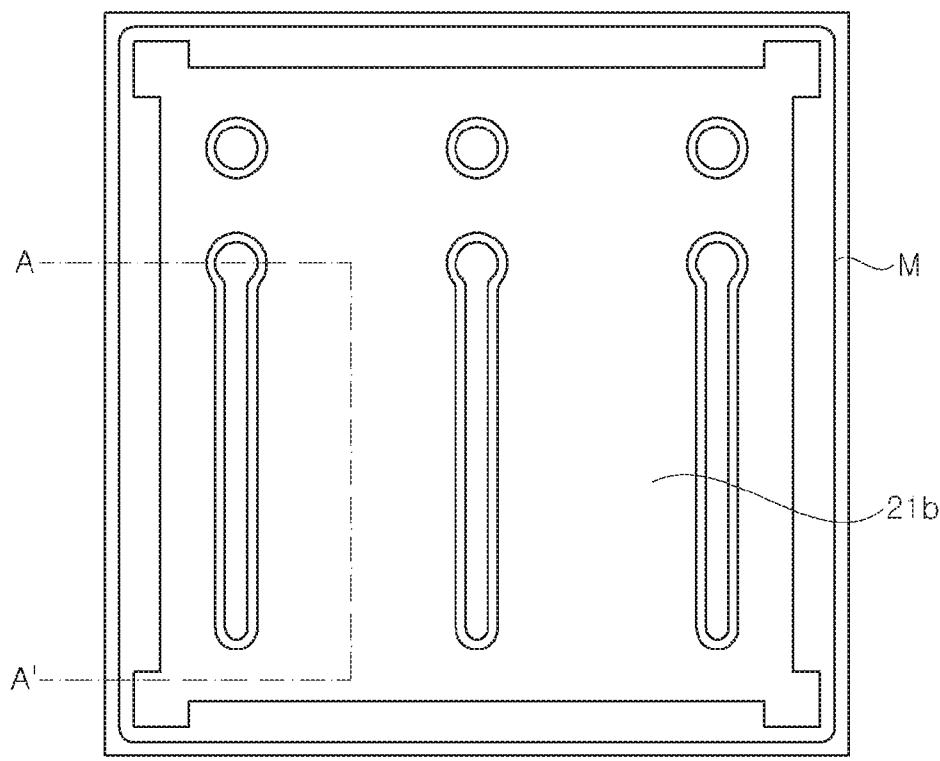
Figure 4B:
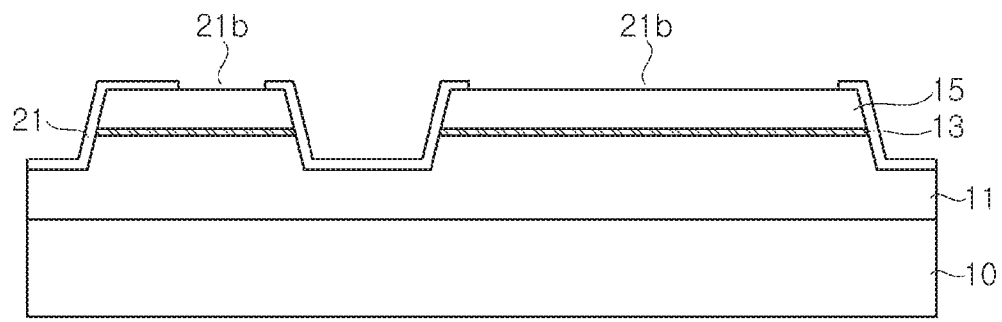

FIGS. 4A and 4B show a process of forming the lower insulation layer 21 and an opening for the second electrode 40. The lower insulation layer 21 may be a silicon oxide (SiO$_2$) layer deposited to a thickness of about 100 nm by plasma-enhanced chemical vapor deposition (PECVD). After deposition of the lower insulation layer 21, a second opening 21b is formed at a location for the second electrode 40 by forming a photoresist pattern (not shown), followed by wet etching.

Figure 5A:
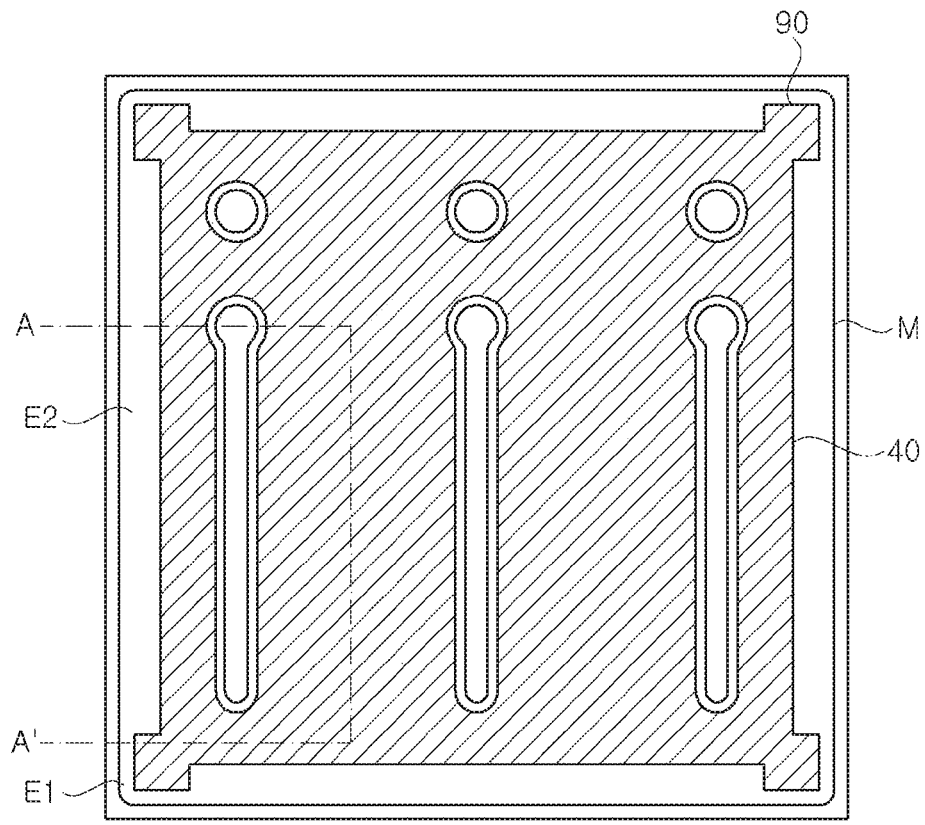
Figure 5B:
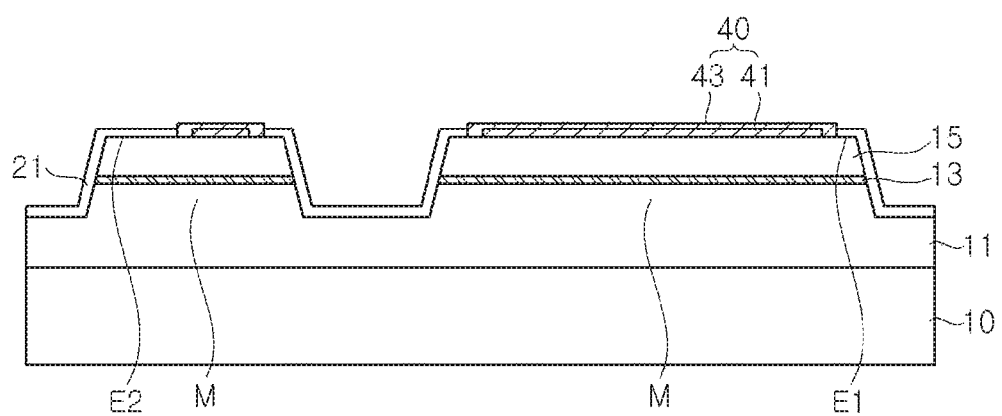

FIGS. 5A and 5B show a process of forming the second electrode 40, in which the second electrode 40 is formed on the second opening 21b through a patterning process such as lift-off. The second electrode 40 may be formed through deposition of a reflection conductive layer 41 having good reflectance using silver (Ag) and the like, and a barrier layer 43 may be formed on an upper surface and/or a side surface of the reflection conductive layer 41. In addition, an ohmic contact layer (not shown) may be further formed on a lower surface of the reflection conductive layer 41 to form ohmic junction with the second conductivity type semiconductor layer 15.

The second electrode 40 is separated a predetermined distance from the periphery of the upper surface of the mesa structure, and may include a first mesa exposing portion E1 having a relatively small separation distance and a second mesa exposing portion E2 having a relatively large separation distance. The second mesa exposing portion E2 may be formed in at least some regions between the second electrode 40 and the periphery of the light emitting diode, for example, between the second electrode 40 and four sides of the light emitting diode, and a reflective electrode-enlarged portion 90 may be formed near each of four vertices of the light emitting diode in order to prevent deterioration in current spreading performance. The first mesa exposing portion E1 having a relatively short separation distance between the second electrode 40 and the periphery of the upper surface of the mesa structure may be formed in the region in which the reflective electrode-enlarged portion 90 is formed.

Figure 6A:
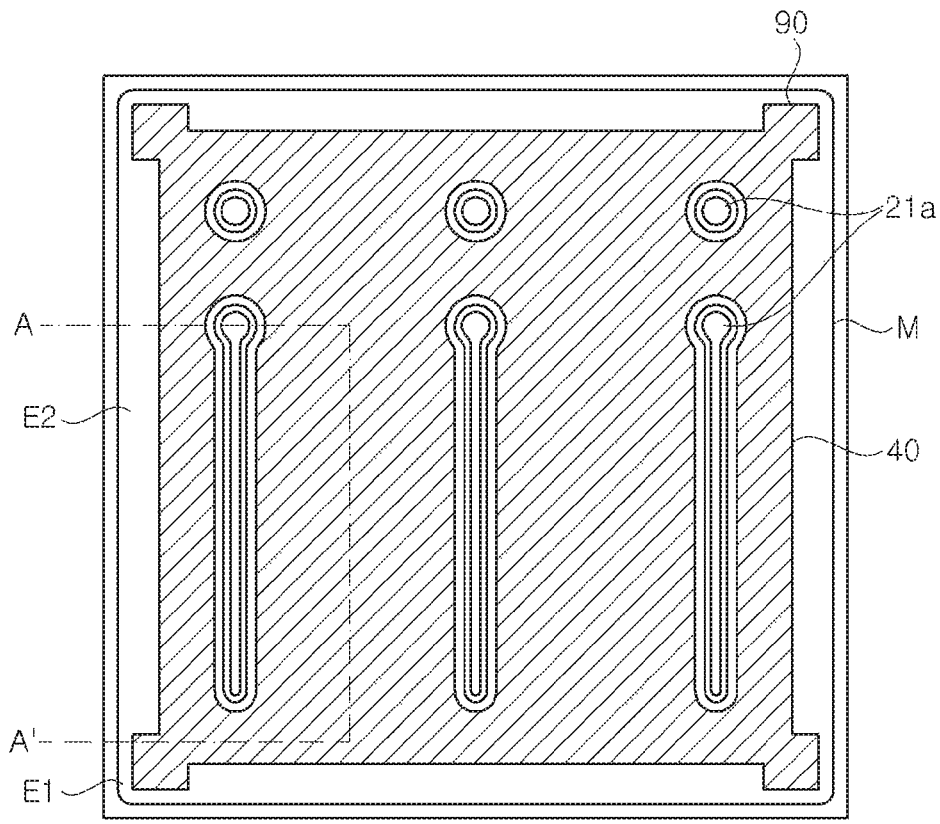
Figure 6B:
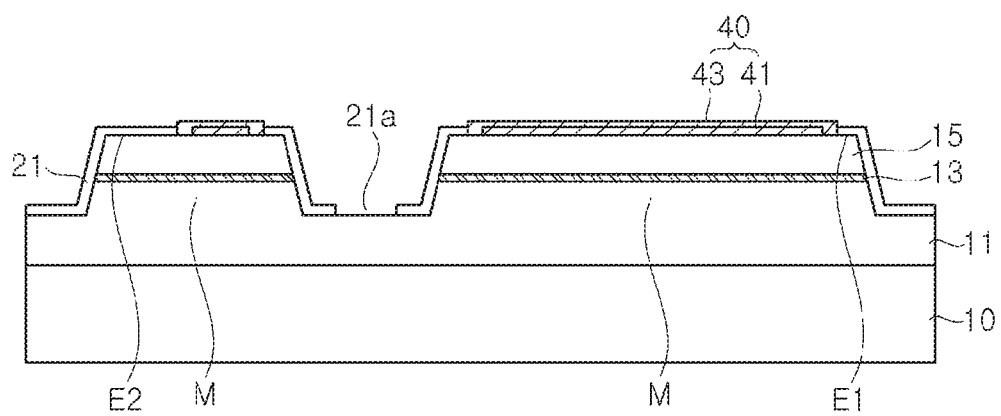

FIGS. 6A and 6B show a process of forming the openings for formation of the first electrodes 30, in which the first openings 21a having a circular shape and a linear shape may be formed, as shown in FIG. 6A. The first openings 21a may be formed by forming a photoresist pattern (not shown), followed by wet etching.

Although the first openings 21a and the second opening 21b may be simultaneously formed on the lower insulation layer 21 by a single process, the first openings 21a and the second opening 21b may be formed by different processes, as described with reference to FIGS. 4A, 4B, 6A, and 6B. This structure may be provided for the purpose of protecting the lower insulation layer 21 deposited on the side surface of the mesa structure. That is, when wet etching is performed after forming the photoresist layer (not shown) on the lower insulation layer 21 to open portions corresponding to the first openings 21a and the second opening 21b, the photoresist layer does not provide sufficient protection to the side surface of the mesa structure, thereby allowing the lower insulation layer 21 formed on the side surface of the mesa structure to be partially removed by an etchant. As a result, the active layer 13 on the side surface of the mesa structure is exposed and thus can be damaged by ions during ion etching before deposition of the insulating reflection portion 50, thereby causing deterioration in device characteristics. Accordingly, it is possible to prevent deterioration in device characteristics by forming the first openings 21a and the second opening 21b on the lower insulation layer 21 through different processes.

Figure 7A:
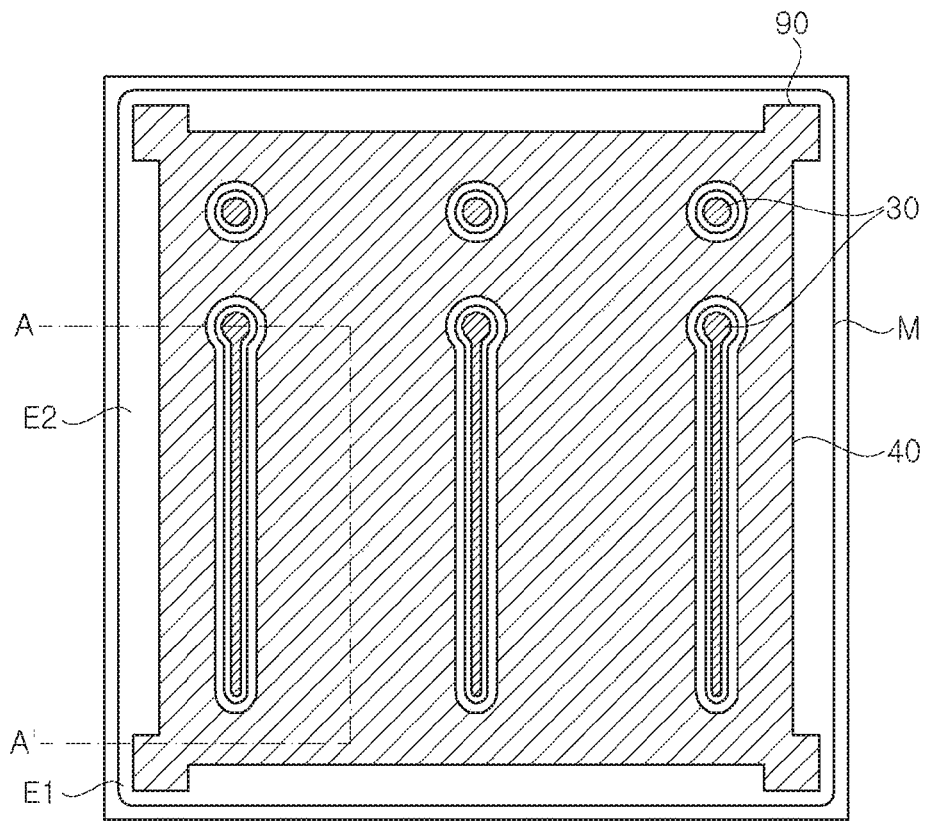
Figure 7B:
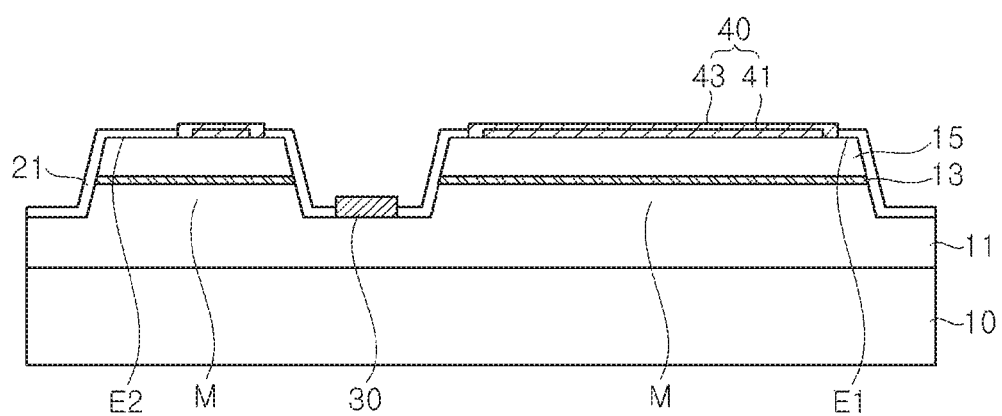

FIGS. 7A and 7B show a process of forming the first electrodes 30 on the first openings 21a, in which the first electrodes 30 are formed in circular and linear patterns, as shown in FIG. 7A. The first electrodes 30 may be formed by patterning an electrically conductive metal such as aluminum (Al) through a lift-off process, and may have a multi-layer structure including an upper or lower bonding layer formed of titanium (Ti), chromium (Cr) or nickel (Ni), or an upper or lower protective layer formed of nickel (Ni), chromium (Cr) or gold (Au) in order to secure ohmic junction or good adhesion to the first conductivity type semiconductor layer 11.

Figure 8A:
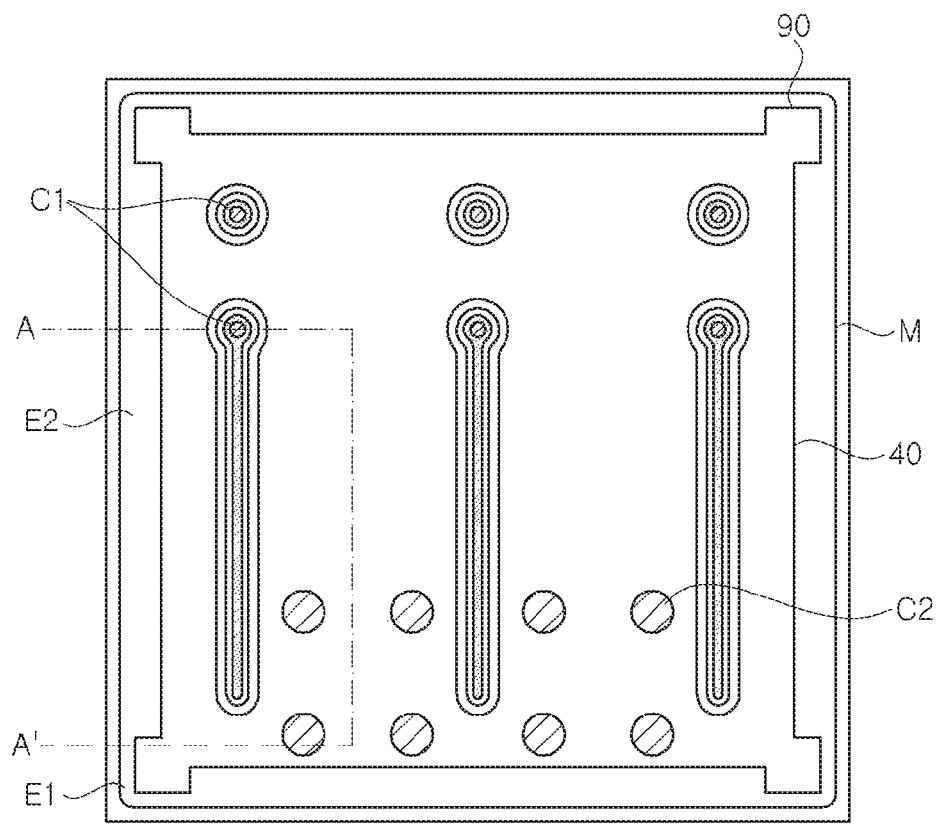
Figure 8B:
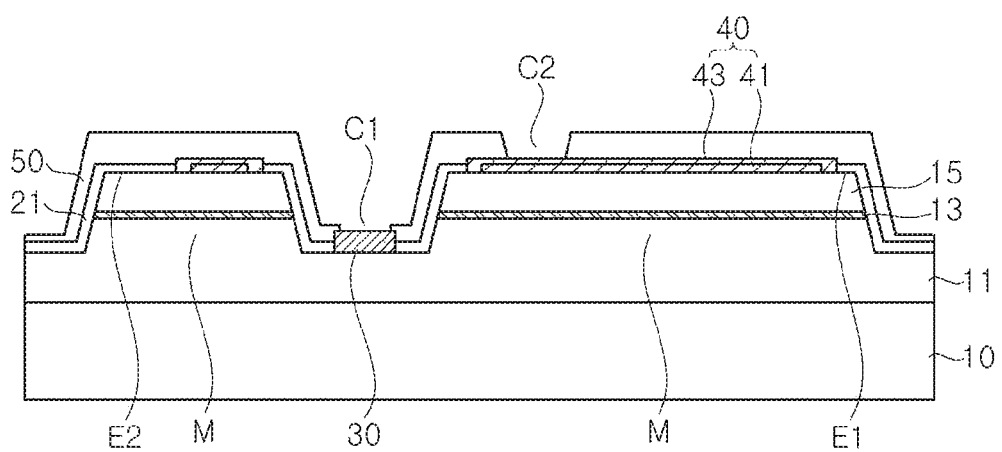

FIGS. 8A and 8B show a process of forming the insulating reflection portion 50 and the first and second contact portions. As shown in FIGS. 8A and 8B, the insulating reflection portion 50 may be formed over the entirety of the light emitting diode excluding regions corresponding to the first contact portion C1 and the second contact portion C2. The insulating reflection portion 50 may be formed by alternately stacking insulation layers having different indices of refraction, for example, SiO₂ layers and TiO₂ layers. Here, a layer (for example, SiO₂ layer) first deposited on the lower insulation layer 21 may have a thickness of about 200 nm in order to prevent reduction in reflectance depending upon an angle of incidence.

An optical thickness of each of the layers alternately stacked one above another may be determined depending upon reflection wavelength, and the first insulating reflection portion 51 for reflecting light having a relatively long wavelength may be formed prior to the second insulating reflection portion 52 for reflecting light having a relatively short wavelength.

The first contact portion C1 is formed on the first electrode 30 and the second contact portion C2 is formed on the second electrode 40, and the second contact portion C2 may have a larger size than the first contact portion C1. If the first and second contact portions C1, C2 are formed through the etching process after deposition of the insulating reflection portion 50, the first electrode 30 or the second electrode 40 under the contact portions C1 and C2 can be damaged. Thus, the first contact portion C1 and the second contact portion C2 may be formed by a lift-off process.

Figure 9A:
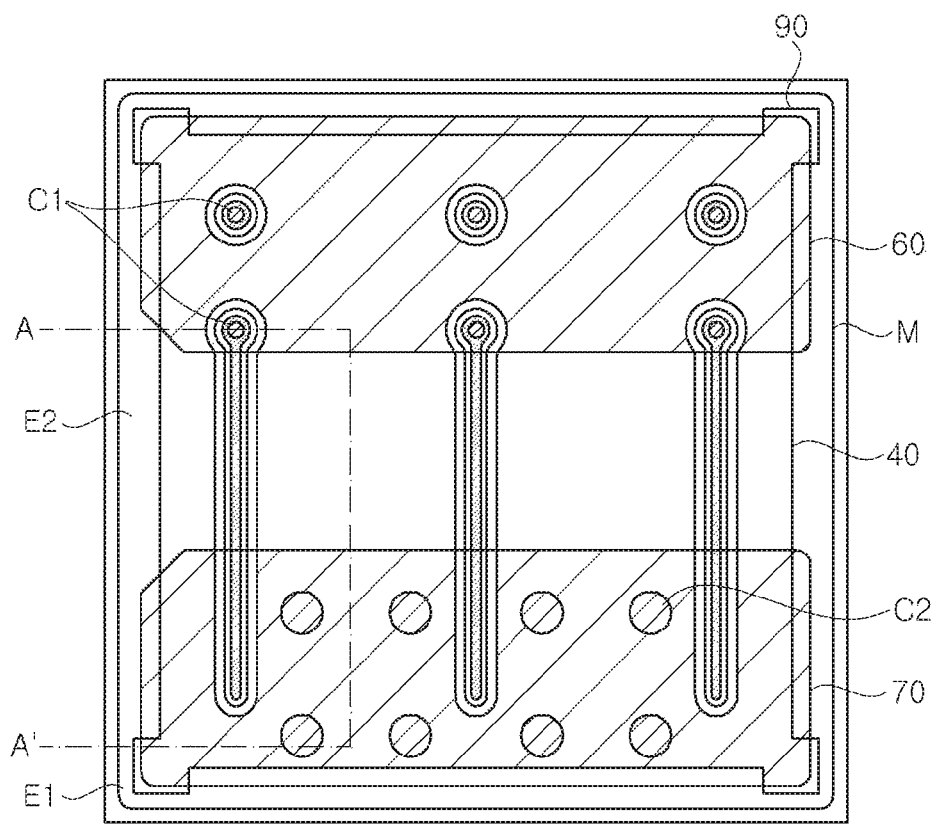
Figure 9B:
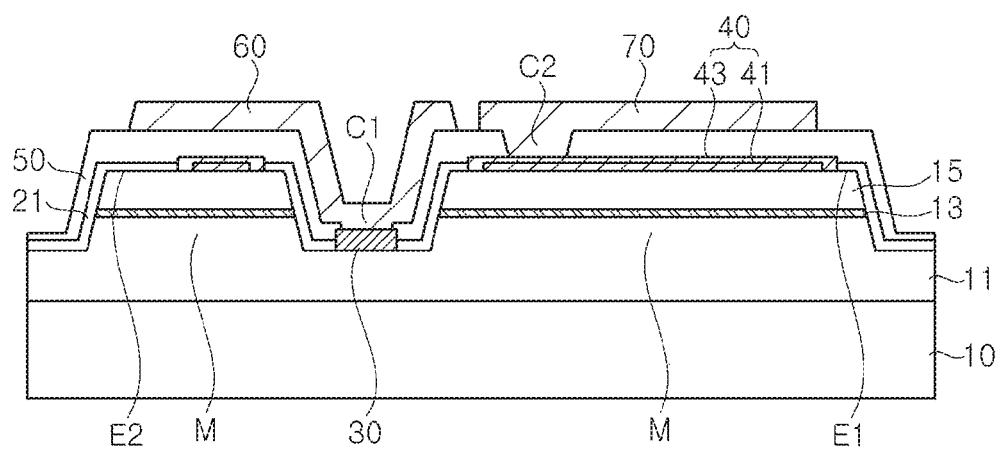

FIGS. 9A and 9B show a process of forming the pads, in which the first pad 60 is formed to be connected to the first electrodes 30 through the first contact portion C1 and the second pad 70 is formed to be connected to the second electrode 40 through the second contact portion C2. The first pad 60 and the second pad 70 may be formed together by the same process, for example, through exposure and an etching or lift-off process. Each of the first pad 60 and the second pad 70 may be formed by stacking a bonding layer of Ti, Cr, or Ni and a high conductivity metal layer of Al, Cu, Ag, or Au.

With the manufacturing method described above, the light emitting diode according to the exemplary embodiment can be efficiently manufactured. Particularly, in the manufacturing method according to the exemplary embodiment, the lower insulation layer 21 for forming the first openings 21a and the second opening 21b on which the first electrodes 30 and the second electrode 40 are disposed, respectively, is formed and can effectively protect the side surfaces of the mesa structure, thereby preventing deterioration in device characteristics due to ion damage during ion etching or deposition for formation of the insulating reflection portion 50. Since it is important to make a deposition surface as flat as possible in order to deposit the insulating reflection portion 50 having good quality, the insulating reflection portion 50 is generally deposited after forming a silicon oxide layer to a predetermined thickness. According to the exemplary embodiments, since the lower insulation layer 21 is previously deposited, it is not necessary to form a separate oxide film for deposition of the insulating reflection portion 50, thereby simplifying the manufacturing process.

Figure 10A:
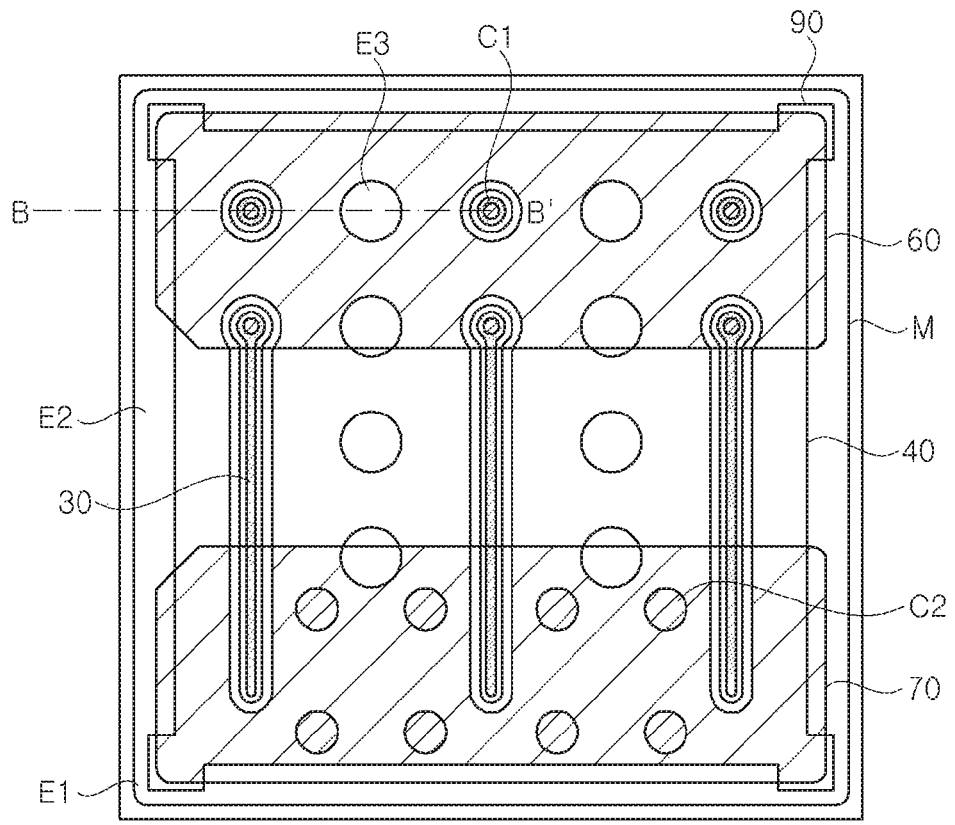
Figure 10B:
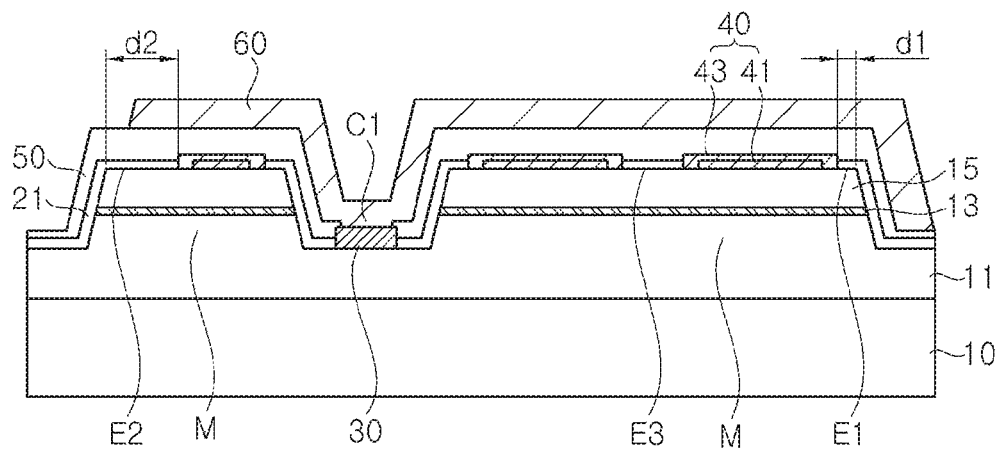

FIGS. 10A and 10B show a light emitting diode according to another exemplary embodiment of the present disclosure, in which FIG. 10A is a plan view and FIG. 10B is a cross-sectional view taken along line B-B' in FIG. 10A. The light emitting diode shown in FIGS. 10A and 10B is different from the light emitting diode shown in FIGS. 1A and 1B in that a third mesa exposing portion E3 is formed in the second electrode 40 on the upper surface of the mesa structure. That is, the second mesa exposing portion E2 is formed between the second electrode 40 and the periphery of the light emitting diode, for example, between the second electrode 40 and four sides of the light emitting diode and thus is not surrounded by the pattern of the second electrode 40, whereas the third mesa exposing portion E3 is formed inside the second electrode 40 and thus is surrounded by the second electrode 40. As in the second mesa exposing portion E2, light can be reflected by the insulating reflection portion 50 in the third mesa exposing portion E3, whereby the light emitting diode shown in FIGS. 10A and 10B can have further improved luminous efficacy.

Figure 11A:
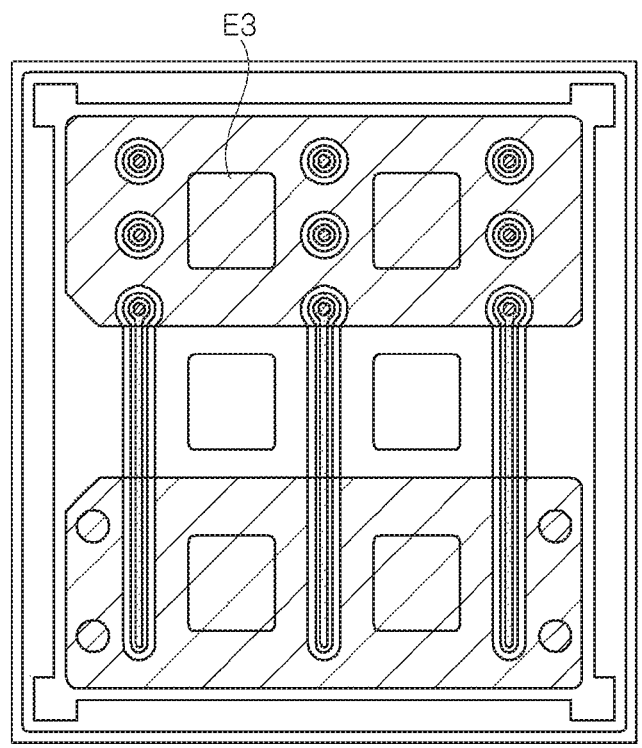
FIG. 11A and FIG. 11B are views of a modification of the light emitting diode shown in FIGS. 10A and 10B.
Figure 11B:
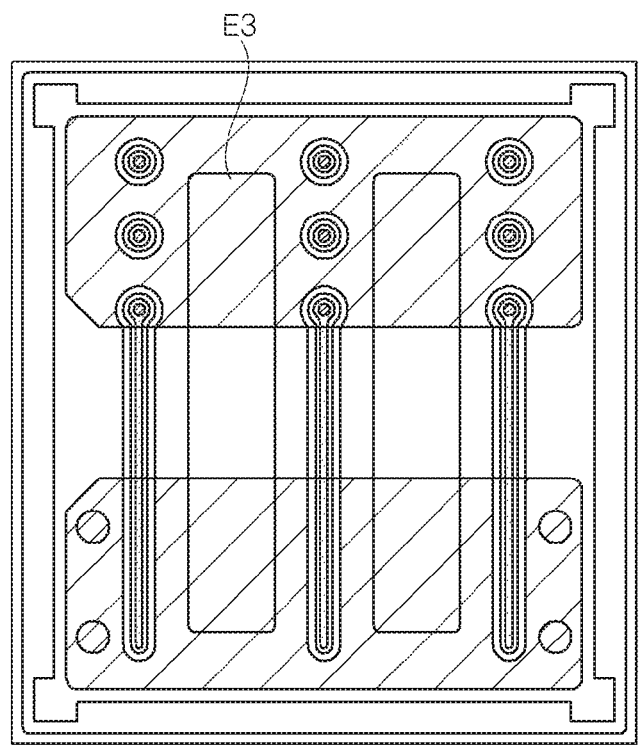

The third mesa exposing portion E3 may be formed in a plurality of circular patterns as shown in FIG. 10, without being limited thereto. For example, the third mesa exposing portion E3 may be formed in at least one rectangular pattern, as shown in FIGS. 11A and 11B, and the amount of light reflected by the insulating reflection portion 50 increases with increasing area of the third mesa exposing portion E3, thereby improving luminous efficacy.

Figure 12A:
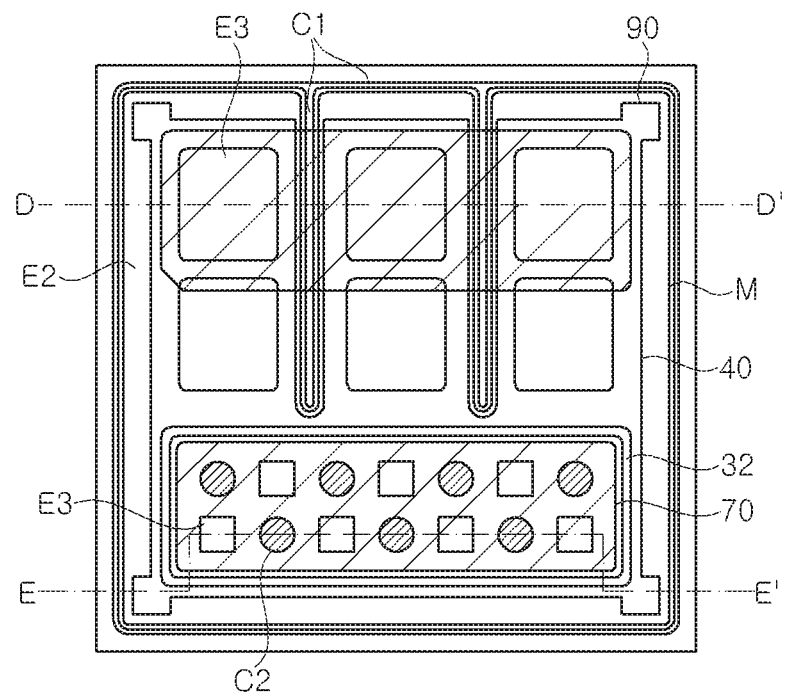
Figure 12B:
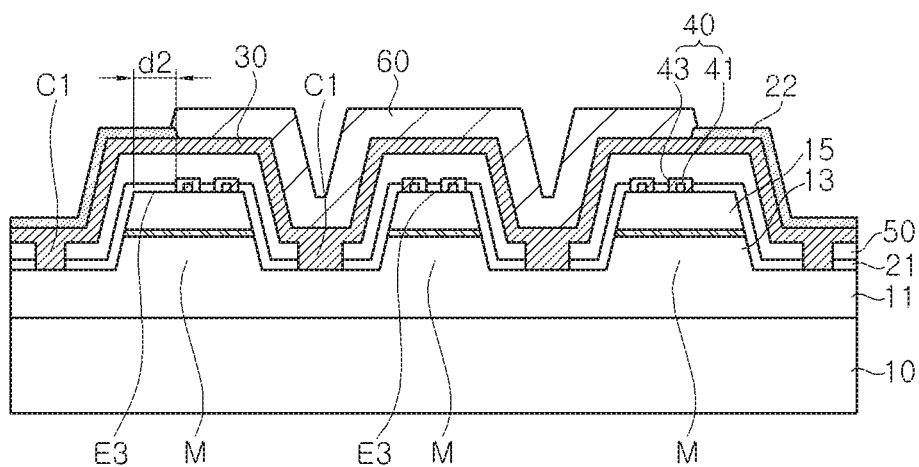
Figure 12C:
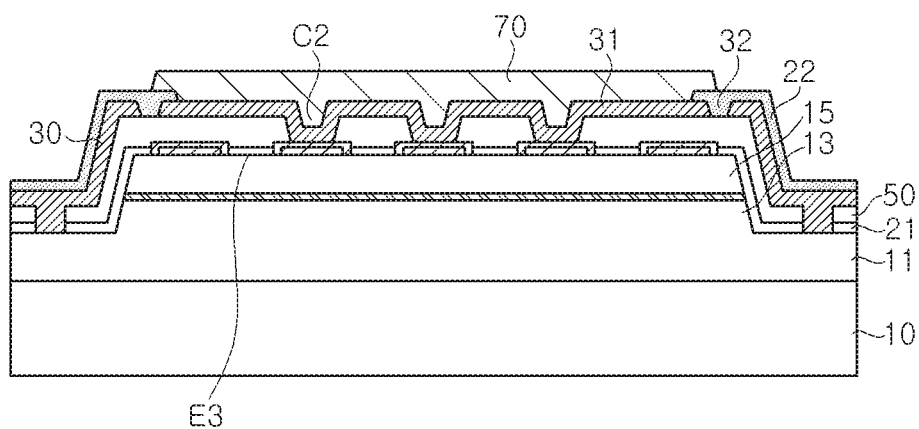

FIGS. 12A, 12B, and 12C show a light emitting diode according to a further exemplary embodiment of the present disclosure, in which FIG. 12A is a plan view, FIG. 12B is a cross-sectional view taken along line D-D' in FIG. 12A, and FIG. 12C is a cross-sectional view taken along line E-E' in FIG. 12A. In the description of the light emitting diode shown in FIGS. 12A, 12B, and 12C, detailed descriptions of the same components as those of the above exemplary embodiments will be omitted.

Referring to FIGS. 12A, 12B, and 12C, the light emitting diode according to this exemplary embodiment includes a mesa structure M formed by sequentially stacking a first conductivity type semiconductor layer 11, an active layer 13 and a second conductivity type semiconductor layer 15 on a substrate 10, followed by mesa etching. In addition, a lower insulation layer 21 is deposited on the overall upper surface of the light emitting diode and a second electrode 40 is formed in an opening of the lower insulation layer 21 on an upper surface of the mesa structure. Here, a second mesa exposing portion E2 having a relatively large separation distance d2 between the second electrode 40 and the periphery of the upper surface of the mesa structure is formed in at least some regions between the second electrode 40 and the periphery of the light emitting diode, for example, between the second electrode 40 and four sides of the light emitting diode, and a reflective electrode-enlarged portion 90 is formed near each of vertices of the light emitting diode. The second mesa exposing portion E2 is provided for improvement in luminous efficacy of the light emitting diode and the reflective electrode-enlarged portion 90 is provided for preventing deterioration in current spreading performance of the light emitting diode, and both features are the same as those of the above exemplary embodiments. Optionally, a third mesa exposing portion E3 may be formed within the second electrode 40 to be surrounded by the second electrode 40, unlike the second mesa exposing portion E2.

An insulating reflection portion 50 is deposited on the second electrode 40 to allow light to be reflected on the upper surfaces of the mesa exposing portions E1, E2, E3 and a side surface of the mesa structure, on which the second electrode 40 is not formed. The second electrode formed of silver (Ag) or the like generally has a reflectance of at most 90% to 94%, whereas the insulating reflection portion 50 acting as a distributed Bragg reflector can achieve a reflectance of about 99% in a desired wavelength range through adjustment of the optical thicknesses of insulation layers stacked therein. The insulating reflection portion 50 may have a stacked structure in which a first insulating reflection portion 51 for reflecting light having a relatively long wavelength and a second insulating reflection portion 52 for reflecting light having a relatively short wavelength are sequentially deposited on the lower insulation layer 21. With this structure, the light emitting diode according to this exemplary embodiment is coupled to, for example, a wavelength conversion layer (not shown) excited by light generated from the active layer to emit light having a longer wavelength than the light generated from the active layer, thereby providing a light emitting diode package having further improved luminous efficacy. In addition, the insulating reflection portion 50 may further include a third insulating reflection portion having a different reflection wavelength range than the first and second insulating reflection portions 51 and 52.

The insulating reflection portion 50 is formed with a first contact portion C1, which exposes at least part of the first conductivity type semiconductor layer 11 and a second contact portion C2, which exposes at least part of the second electrode 40. Referring to FIG. 12(a), the first contact portion C1 may have a linear shape and the second contact portion C2 may have a contact-hole shape. In addition, as shown in FIG. 12, the first contact portion C1 may be formed along the periphery of the light emitting diode, thereby improving current spreading performance in the first conductivity type semiconductor layer 11.

First electrodes 30 and a second electrode connection pad 31 are formed on the insulating reflection portion 50. The first electrodes 30 are electrically connected to the first conductivity type semiconductor layer 11 through the first contact portion C1 and may be formed over the entire region of the light emitting diode excluding a region in which the second electrode connection pad 31 is formed. The second electrode connection pad 31 is isolated from the first electrodes 30 by a cut-out portion 32 and is electrically connected to the second electrode 40 through the second contact portion C2. The first electrodes 30 and the second electrode connection pad 31 may be formed of aluminum (Al) and may include a multilayer structure that includes a bonding layer formed of titanium (Ti), chromium (Cr) or nickel (Ni), or a protective layer formed of nickel (Ni), chromium (Cr) or gold (Au) at an upper or lower side thereof. The first electrodes 30 and the second electrode connection pad 31 may be formed by the same process.

An upper insulation layer 22 may be formed on the first electrodes 30 and the second electrode connection pad 31. The upper insulation layer 22 may be provided for passivation of the entire upper surface of the light emitting diode excluding portions corresponding to the pads 60, 70 while filling the cut-out portion between the first electrodes 30 and the second electrode connection pad 31, and may be formed of silicon nitride ($SiN_x$).

After via-holes for connection of pads are formed in the upper insulation layer 22, a first pad 60 and a second pad 70 are formed thereon. The first pad 60 is electrically connected to the first conductivity type semiconductor layer 11 through the first electrodes 30, and the second pad 70 is electrically connected to the second conductivity type semiconductor layer 15 through the second electrode connection pad 31 and the second electrode 40. The first pad 60 and the second pad 70 may be used as pads for connection of bumps or for surface-mount technology (SMT) to mount the light emitting diode on a submount, a package or a printed circuit board.

In the light emitting diode according to this exemplary embodiment, light is reflected by the insulating reflection portion 50 in the second mesa exposing portion E2 and, optionally, the third mesa exposing portion E3, thereby providing further improved luminous efficacy than the light emitting diode in which light is reflected by the second electrode 40.

According to this exemplary embodiment, the reflective electrode-enlarged portion 90 is formed near each of the vertices of the light emitting diode by enlarging the second electrode 40, thereby preventing deterioration in current spreading performance due to formation of the second mesa exposing portion E2.

Unlike the above exemplary embodiments, in the light emitting diode according to this exemplary embodiment, the first electrodes 30 extend to the periphery of the light emitting diode, thereby improving current spreading in the first conductivity type semiconductor layer 11. In addition, the second electrode connection pad 31 for electrical connection to the second electrode 40 may also be formed together with the first electrodes 30, thereby simplifying the manufacturing process.

Next, a method of manufacturing the light emitting diode according to this exemplary embodiment will be described with reference to FIG. 13A to FIG. 18B. In FIGS. 13A, 13B, 14A, and 14B, FIGS. 13A and 14A are plan views, and FIGS. 13B and 14B are cross-sectional views taken along a line D-D' in FIGS. 13A and 14A, respectively. In FIGS. 15A-15C, 16A-16C, 17A-17C, and 18A-18C, FIGS. 15A, 16A, 17A, and 18A are plan views, FIGS. 15B, 16B, 17B, and 18B are cross-sectional views taken along line D-D' in each of FIGS. 15A, 16A, 17A, and 18A, respectively, and FIGS. 15C, 16C, 17C, and 18C are cross-sectional views taken along line F-F' in each of FIGS. 15A, 16A, 17A, and 18A, respectively. Here, it should be understood that implementations of the present disclosure are not limited to the light emitting diode manufactured by a particular manufacturing method and the manufacturing method described below is provided for illustration and understanding of the structure of light emitting diodes according to exemplary embodiments of the present disclosure. In the description of the light emitting diode shown in FIG. 13A to FIG. 18B, detailed descriptions of the same components as those of the above exemplary embodiments will be omitted.

Figure 13A:
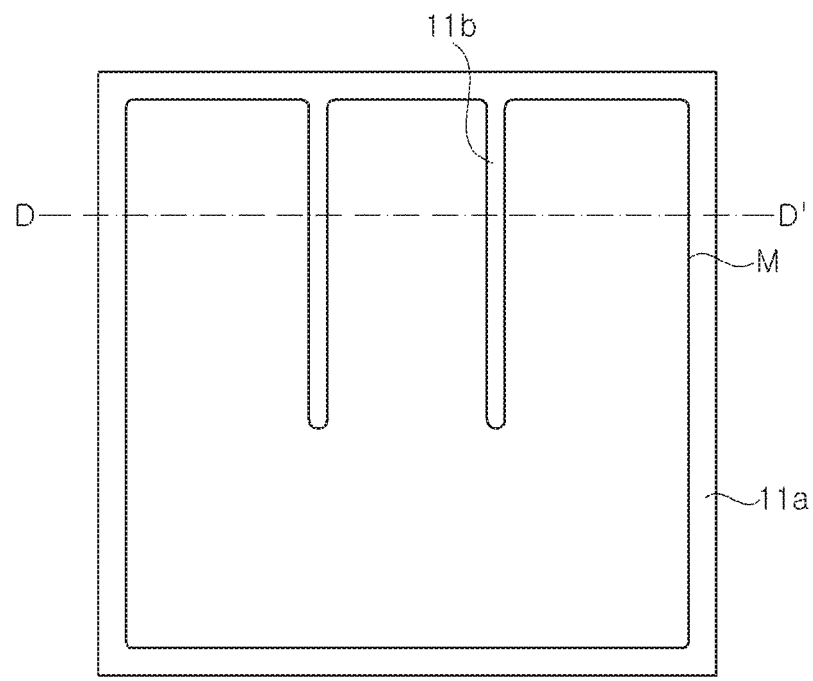
Figure 13B:
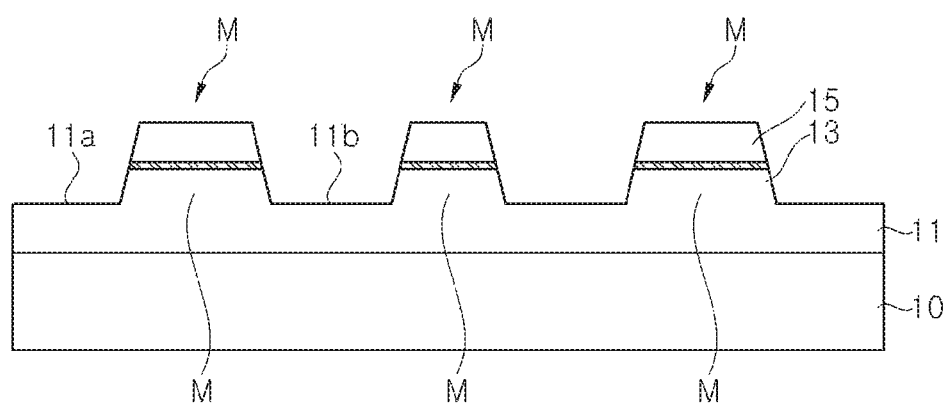

FIGS. 13A and 13B show a process of forming the mesa structure, in which the first conductivity type semiconductor layer 11, the active layer 13 and the second conductivity type semiconductor layer 15 are sequentially deposited on a substrate 10, followed by exposure and etching to form a mesa structure M. As shown in FIGS. 13A and 13B, the first conductivity type semiconductor layer 11 is exposed along the periphery of the light emitting diode to form an exposed region 11a of the first conductivity type semiconductor layer 11 and exposed at other portions thereof to form a linear exposed region 11b of the first conductivity type semiconductor layer 11.

Figure 14A:
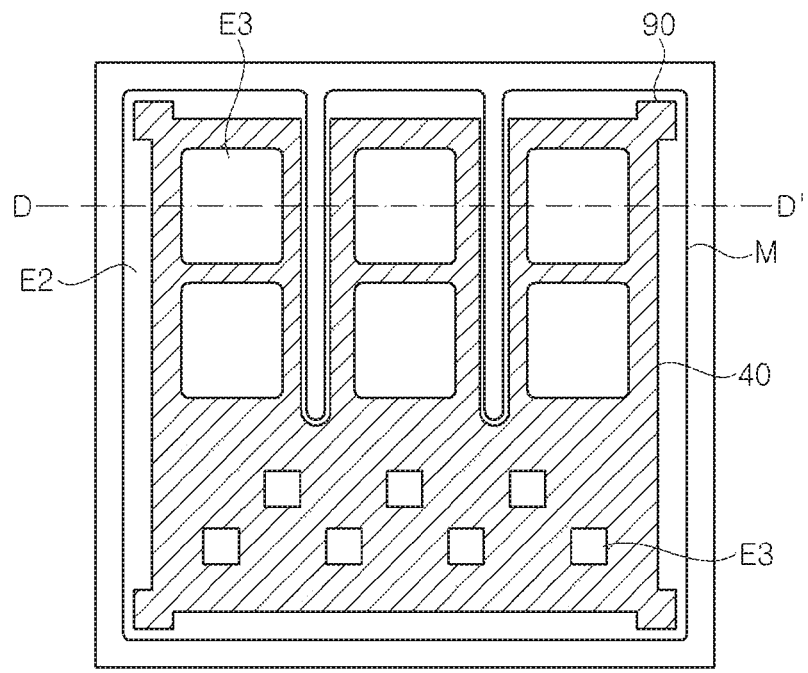
Figure 14B:
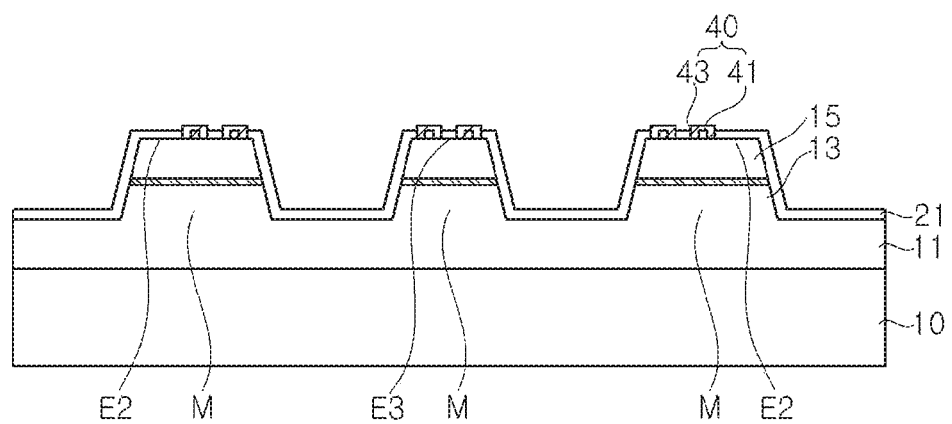

FIGS. 14A and 14B show a process of forming the lower insulation layer 21 and the second electrode 40. After deposition of the lower insulation layer 21, a portion of the lower insulation layer 21 corresponding to the second electrode 40 is removed by forming a photoresist pattern (not shown), followed by wet etching, and a pattern of the second electrode 40 may be formed in the exposed regions of the lower insulation layer 21 by a lift-off process. Referring to FIGS. 14A and 14B, the second mesa exposing portion E2 having a relatively large separation distance between the second electrode 40 and the periphery of the upper surface of the mesa structure is formed in at least some regions between the second electrode 40 and the periphery of the light emitting diode, for example, between the second electrode 40 and the four sides of the light emitting diode, and, optionally, the third mesa exposing portion E3 is formed inside the second electrode 40 so as to be surrounded by the second electrode 40. In order to prevent deterioration in current spreading performance due to formation of the second mesa exposing portion E2, the reflective electrode-enlarged portion 90 is formed at a portion of a corner of the light emitting diode, for example, near each of the vertices of the light emitting diode to form the first mesa exposing portion E1 having a smaller separation distance between the second electrode 40 and the periphery of the upper surface of the mesa structure than the second mesa exposing portion E2.

Figure 15A:
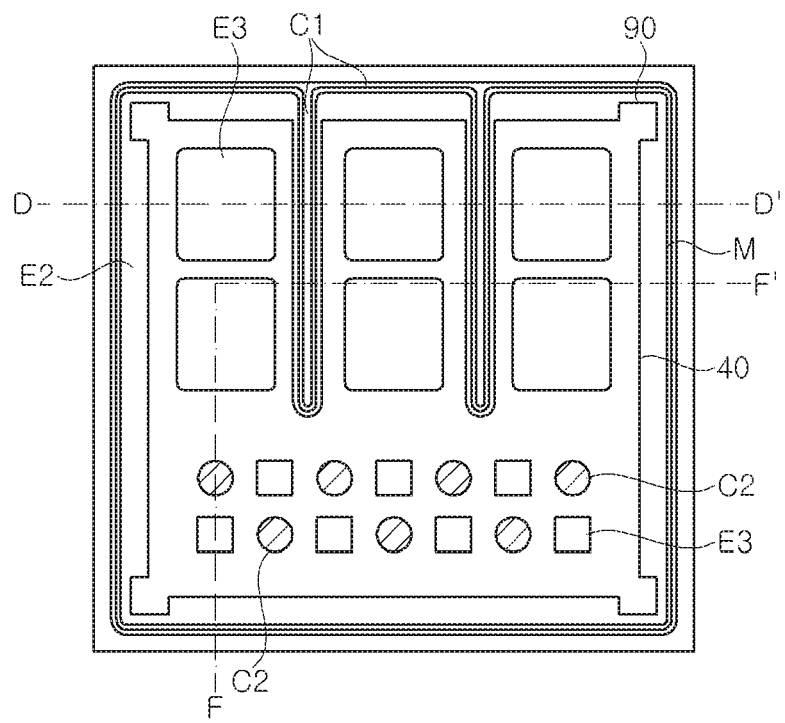
Figure 15B:
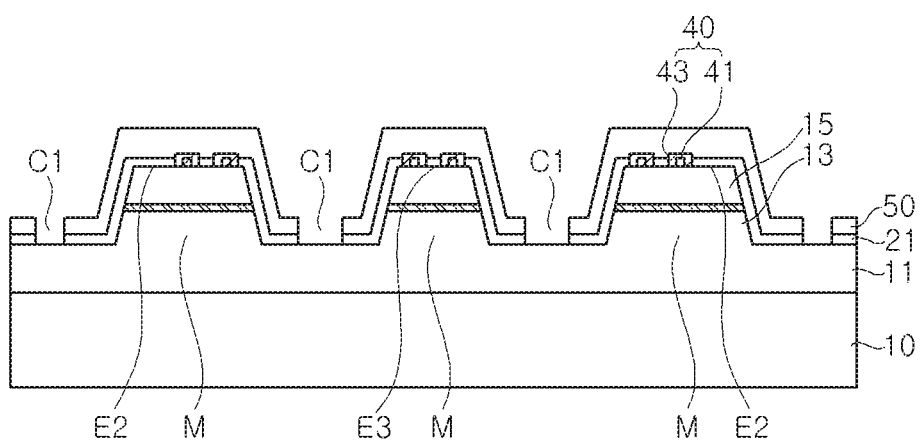
Figure 15C:
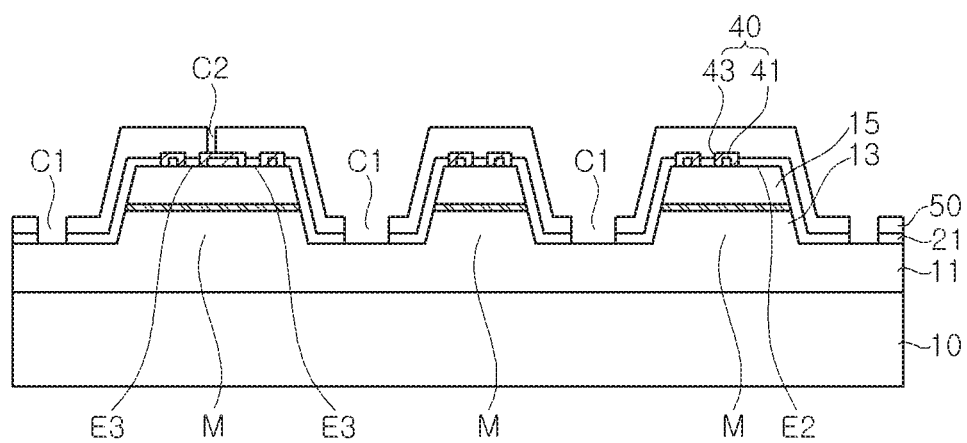

FIGS. 15A-15C show a process of forming the insulating reflection portion 50 and the first and second contact portions. The insulating reflection portion 50 may be formed over the entirety of the light emitting diode excluding portions corresponding to the first contact portion C1 and the second contact portion C2. The insulating reflection portion 50 may be formed by alternately stacking insulation layers having different indices of refraction, and an optical thickness of each of the layers alternately stacked one above another may be determined depending upon reflection wavelength. In the insulating reflection portion 50, the first insulating reflection portion 51 for reflecting light having a relatively long wavelength may be formed prior to the second insulating reflection portion 52 for reflecting light having a relatively short wavelength in order to improve luminous efficacy in a package state.

The first contact portion C1 is an opening for electrical connection between the first electrodes 30 and the first conductivity type semiconductor layer 11, and may be formed on the exposure region 11a of the first conductivity type semiconductor layer at the periphery of the light emitting diode and on the linear exposed region 11b of the first conductivity type semiconductor layer.

Figure 16A:
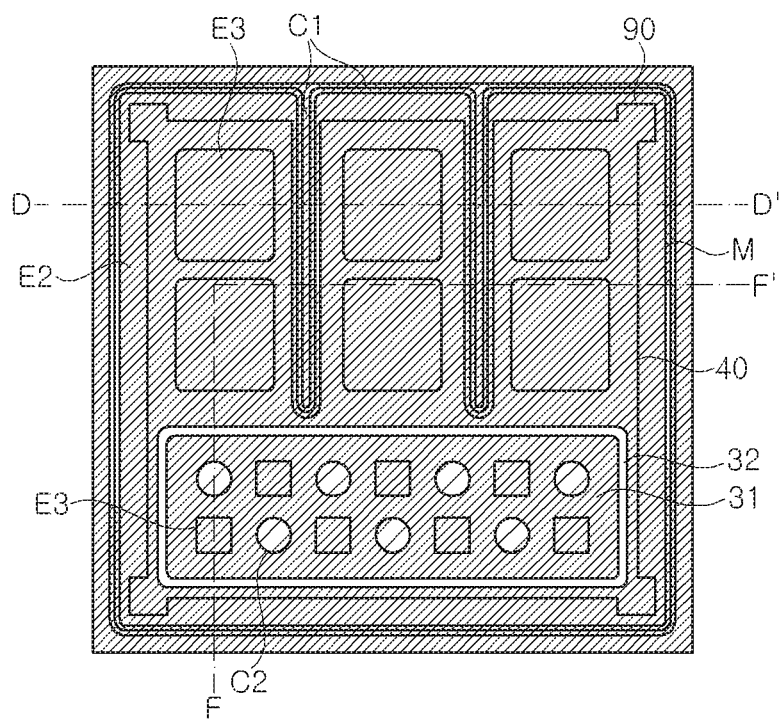
Figure 16B:
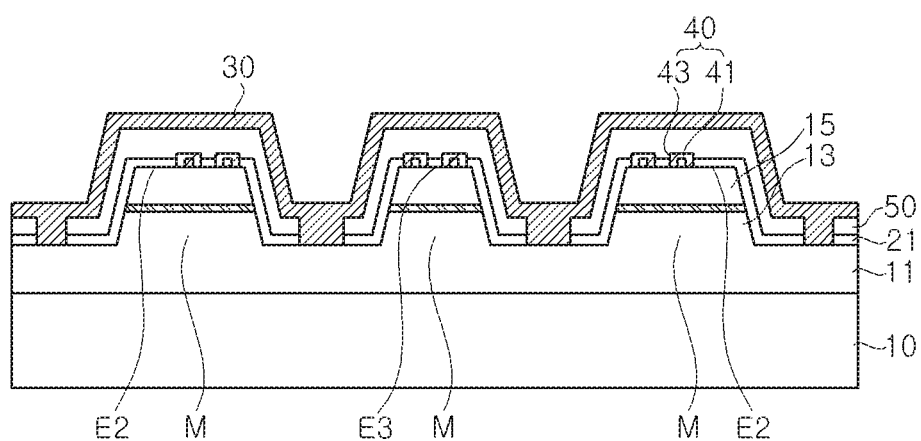

FIGS. 16A-16C show a process of forming the first electrodes 30 and the second electrode connection pad 31, in which an electrically conductive layer of aluminum (Al) or the like is formed and then subjected to patterning such that the first electrodes 30 and the second electrode connection pad 31 are separated from each other by the cut-off portion 32. Patterning may be performed through exposure and an etching or lift-off process.

Figure 17B:
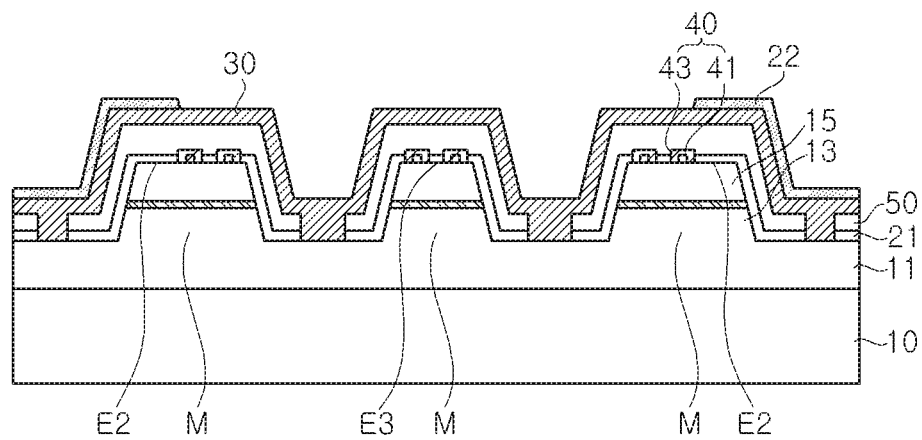
Figure 17C:
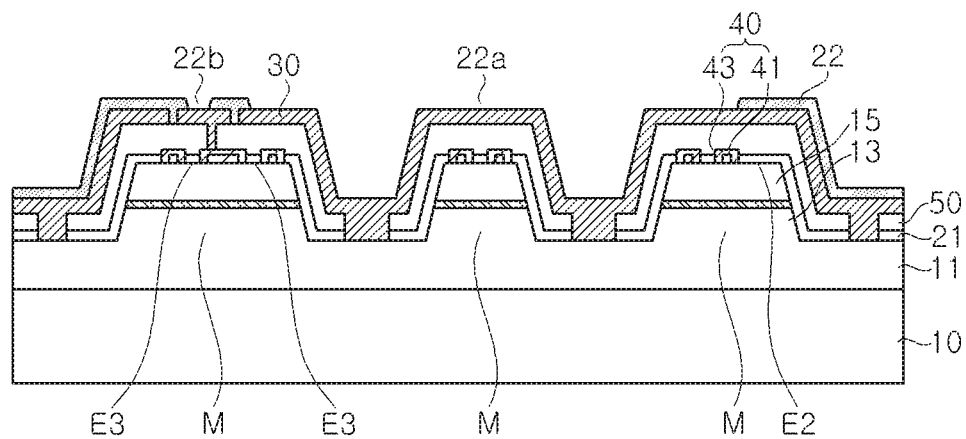
Figure 18A:
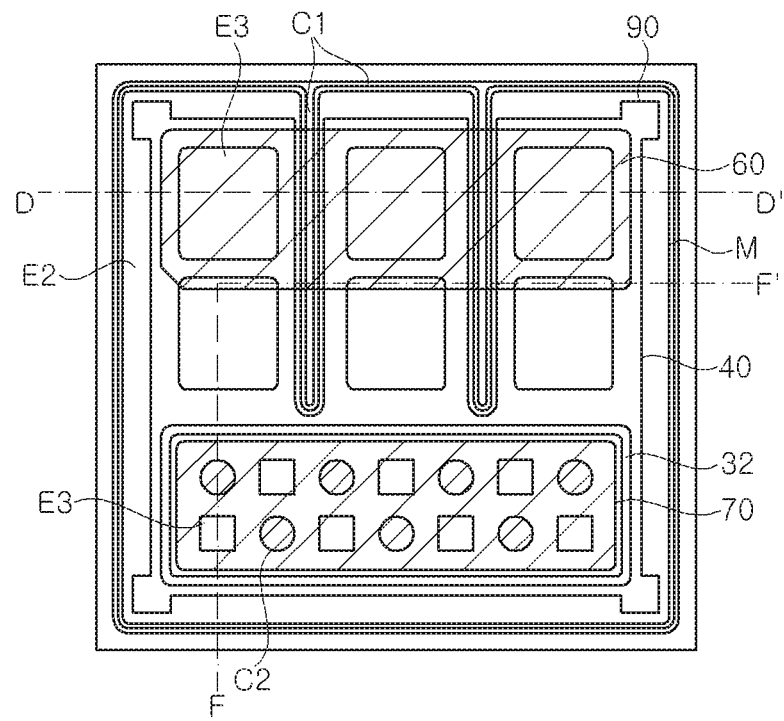
Figure 18B:
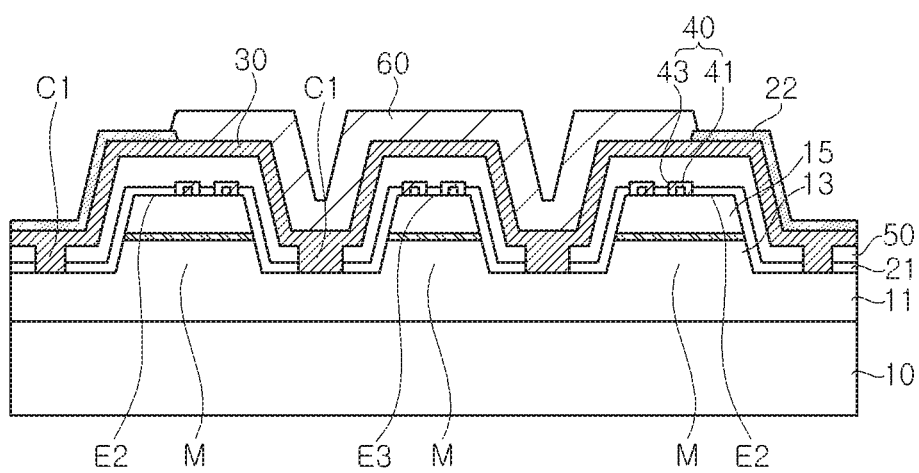
Figure 18C:
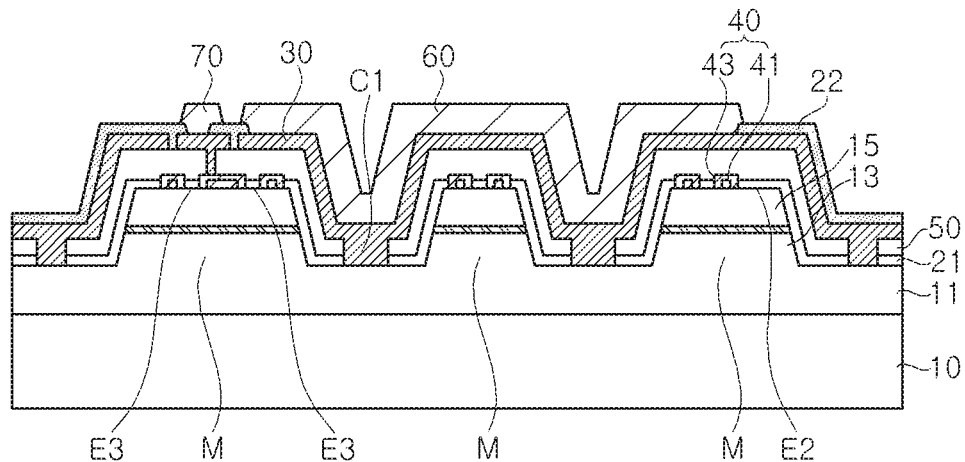

FIGS. 17A-17C show a process of forming via-holes 22a, 22b on the upper insulation layer 22 for formation of the first pad 60 and the second pad 70, and FIGS. 18A-18C show a process of forming the first pad 60 and the second pad 70 on the via-holes 22a, 22b. The first pad 60 is electrically connected to the first electrode 30 through the via-hole 22a, and the second pad 70 is electrically connected to the second electrode connection pad 31 through the via-hole 22b, so that the first pad 60 and the second pad 70 are electrically connected to the second electrode 40 and the second conductivity type semiconductor layer 15. The first pad 60 and the second pad 70 may be formed by the same process, for example, through exposure and an etching or lift-off process.

Figure 19:
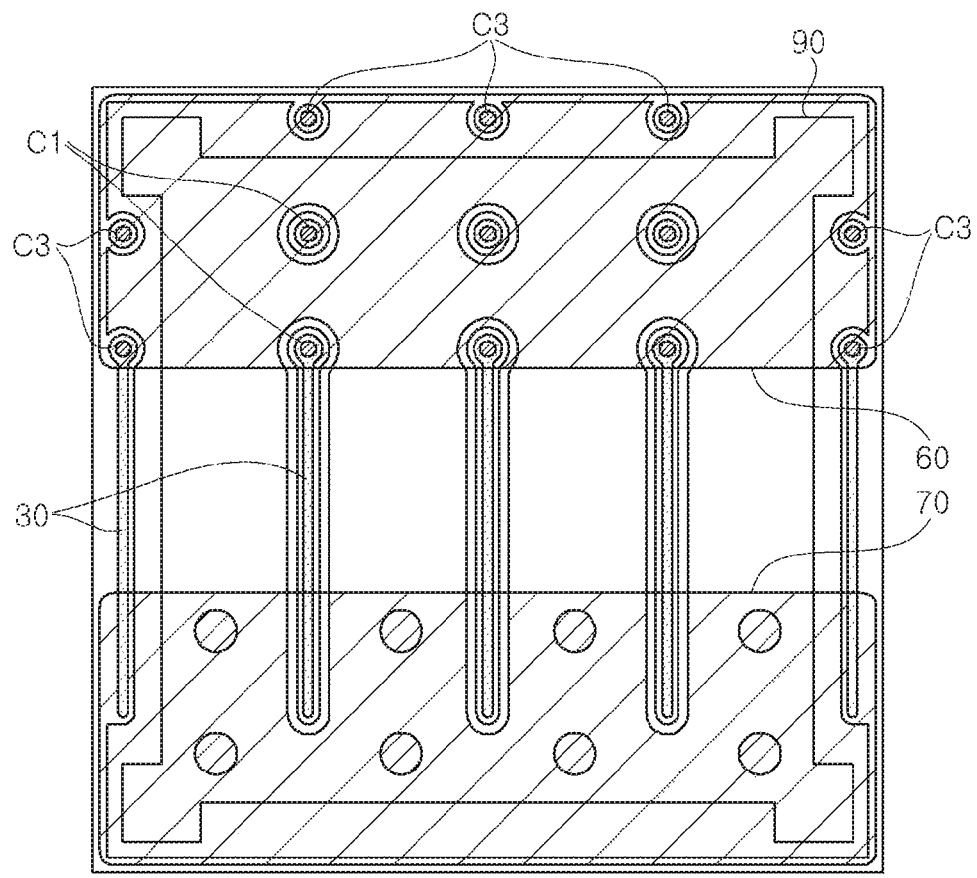
FIG. 19 is a plan view of a light emitting diode according to yet another exemplary embodiment of the present disclosure.

FIG. 19 is a plan view of a light emitting diode according to yet another exemplary embodiment of the present disclosure.

Referring to FIG. 19, the light emitting diode according to this exemplary embodiment is substantially the same as the light emitting diode described with reference to FIG. 1 except for additional first electrodes 30. Specifically, in the exemplary embodiment shown in FIG. 1, the first electrodes 30s are disposed only within the mesa structure M, whereas the light emitting diode according to this exemplary embodiment includes additional first electrodes 30 disposed outside the mesa structure M. The first electrodes 30 are exposed through a third contact portion C3 formed on the insulating reflection portion 50 and electrically connected to the first pad 60.

The additional first electrodes 30 may be formed, for example, near three sides adjacent to each other, respectively. Like the first electrodes 30 disposed within the mesa structure M, the first electrodes 30 disposed outside the mesa structure M may have a circular shape and a linear shape. As shown in FIG. 19, the linear first electrodes 30 may be disposed at opposite sides facing each other and parallel to the linear first electrodes 30 disposed within the mesa structure M. The linear first electrodes 30 are arranged at substantially constant intervals. In addition, the circular first electrodes 30 are disposed at one side between the opposite sides facing each other.

The first pad 60 covers the first electrodes 30 disposed outside the mesa structure M to be electrically connected thereto. The second pad 70 is separated from the first electrodes 30 by the insulating reflection portion 50.

The light emitting diodes include grooves formed on three sides of the mesa structure M and the first electrodes 30 are disposed on these grooves. Here, in order to form the first electrodes 30 having a circular shape, the grooves formed in the mesa structure M may have a circular shape open at one side thereof and having a larger size than a semicircular shape.

Figure 20:
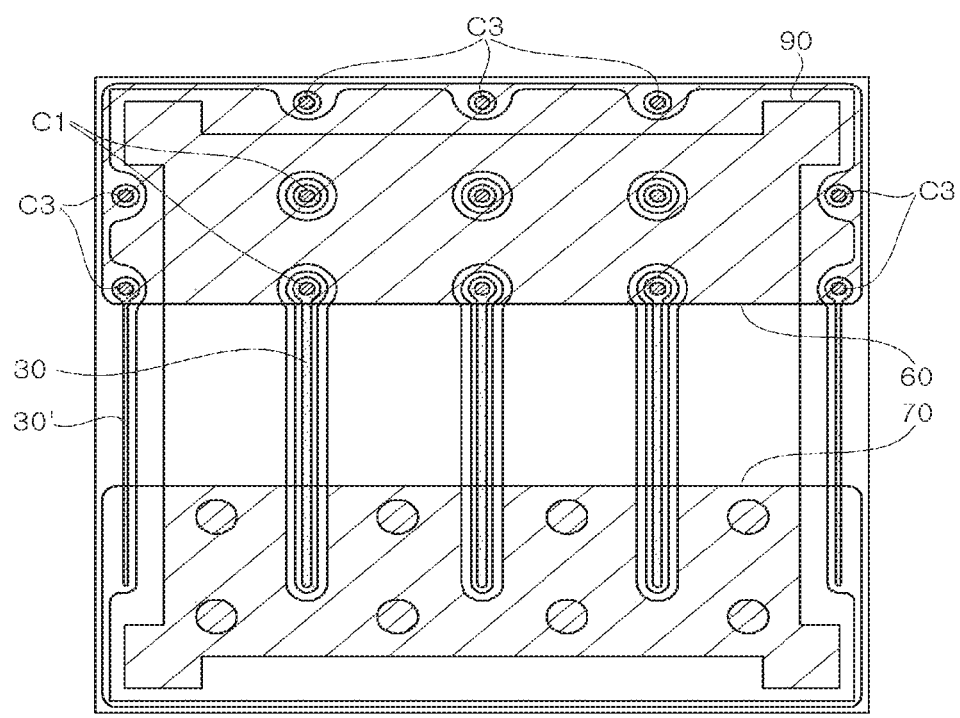
FIG. 20 is a plan view of a light emitting diode according to yet another exemplary embodiment of the present disclosure.

FIG. 20 is a plan view of a light emitting diode according to yet another exemplary embodiment of the present disclosure.

Referring to FIG. 20, the light emitting diode according to this exemplary embodiment is substantially the same as the light emitting diode described with reference to FIG. 19 excluding the shape of the grooves formed on three sides of the mesa structure M and the arrangement of the linear first electrodes 30', which are disposed outside the mesa structure M and arranged at narrower intervals than the linear first electrodes disposed within the mesa structure M.

That is, in the exemplary embodiment shown in FIG. 19, the grooves formed on three sides of the mesa structure M have a circular shape open at one side thereof, whereas, in this exemplary embodiment of FIG. 20, the grooves have a substantially semicircular shape. In addition, the width of the first electrodes 30' disposed outside the mesa structure M and having a linear shape may be half the width of the first electrodes 30 disposed within the mesa structure.

Figure 21:
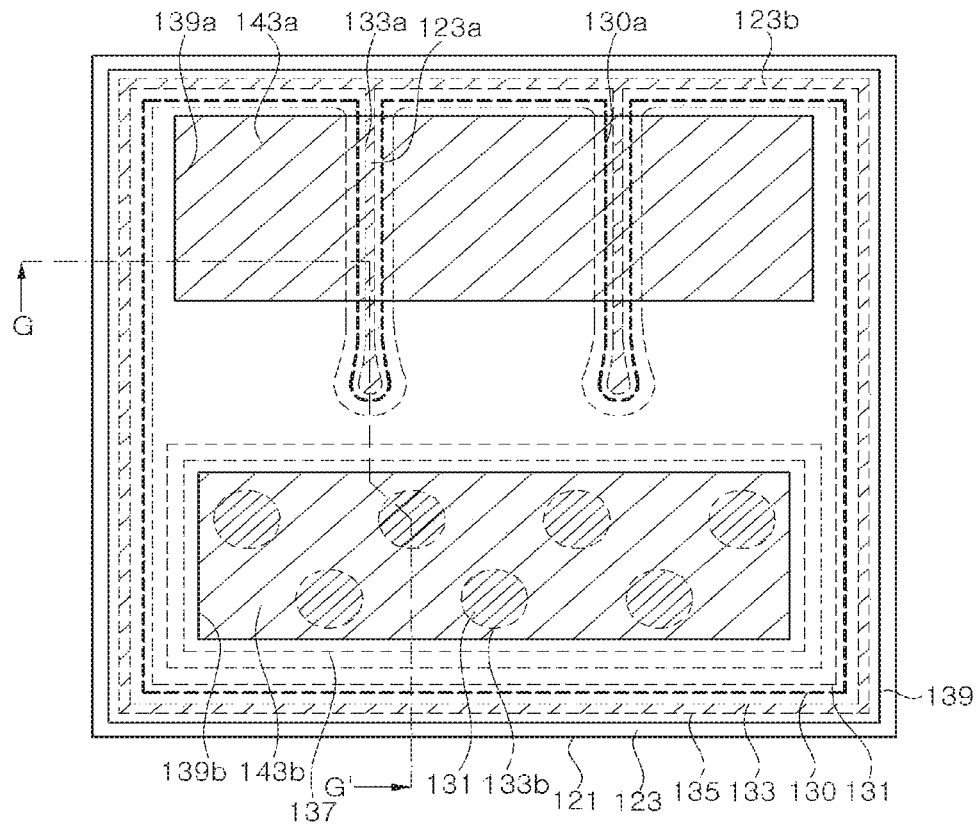
FIG. 21 is a plan view of a light emitting diode according to yet another exemplary embodiment of the present disclosure.
Figure 22:
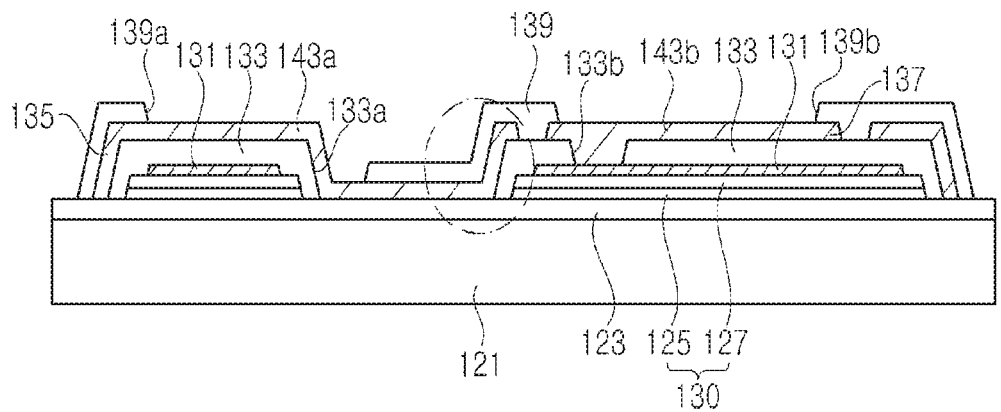
FIG. 22 is a cross-sectional view taken along line G-G' of FIG. 21.

FIG. 21 is a plan view of a light emitting diode according to yet another exemplary embodiment of the present disclosure. FIG. 22 is a cross-sectional view taken along line G-G' of FIG. 21.

Referring to FIG. 21 and FIG. 22, the light emitting diode according to this exemplary embodiment includes a lower semiconductor layer 123, an active layer 125, an upper semiconductor layer 127, a reflective insulation layer 133, and a first electrode layer 135. The light emitting diode includes a mesa 130 disposed on a lower semiconductor layer 123 and including the upper semiconductor layer 127 and the active layer 125. Furthermore, the light emitting diode may include a substrate 121, a conductive layer 131, a second electrode layer 137, and an upper insulation layer 139, and may further include a first electrode pad region 143a and a second electrode pad region 143b in which the first electrode layer 135 and the second electrode layer 137 are exposed through openings 139a, 139b of the upper insulation layer 139.

The substrate 121 may be selected from any substrates on which gallium nitride semiconductor layers can be grown, and may include a sapphire substrate, a silicon carbide substrate, a gallium nitride (GaN) substrate, a spinel substrate, or the like. In particular, the substrate 121 may be a patterned substrate such as a patterned sapphire substrate. Although the substrate 121 is shown and described in the drawings, the light emitting diode according to this exemplary embodiment does not necessarily include the substrate 121, and the substrate 121 may be removed from the semiconductor layers by a technique such as a laser lift-off process or a chemical lift-off process.

The lower semiconductor layer 123, the active layer 125, and the upper semiconductor layer 127 may include Group III-V compound semiconductors, for example, nitride-based semiconductors such as (Al, Ga, In)N. The lower semiconductor layer 123 may include includes n-type dopants (for example, Si) and the upper semiconductor layer 127 may include p-type dopants (for example, Mg), or vice versa. The active layer 123 may have a single quantum well structure or a multi-quantum well (MQW) structure. When forward bias is applied to the light emitting diode, electrons and holes are combined with each other in the active layer 125 to emit light. The lower semiconductor layer 123, the active layer 125 and the upper semiconductor layer 127 may be grown on the substrate 121 by a technique such as metal organic chemical vapor deposition (MOCVD) or molecular beam epitaxy (MBE).

The mesa 130 is formed by patterning the upper semiconductor layer 127 and the active layer 125 grown on the substrate 121. Accordingly, the mesa 130 may be disposed on the lower semiconductor layer 123 and may include a portion of the lower semiconductor layer 123 through overetching. An edge of the lower semiconductor layer 123 is exposed around the mesa 130 along the periphery the mesa 130. The mesa 130 has an inclined sidewall.

Referring to FIG. 21 and FIG. 22, an opening 130a exposes the lower semiconductor layer 123 through the upper semiconductor layer 127 and the active layer 125. The opening 130a may extend from a region around the mesa 130 into the mesa 130, but is not limited thereto. Alternatively, the opening 130a may be separated from the region around the mesa. In addition, the light emitting diode may include a plurality of openings 130a and two openings 130a are shown in the drawings.

The conductive layer 131 is disposed on the upper semiconductor layer 127 and contacts the upper semiconductor layer 127. The conductive layer 131 is formed on the upper semiconductor layer 127 or the mesa 130 and is connected to substantially the entirety of the upper semiconductor layer 127. With this structure, the conductive layer 131 spreads current over a broad area of the upper semiconductor layer 127.

The conductive layer 131 may be formed of, for example, a metal layer, but is not limited thereto. The conductive layer 131 may be formed of a transparent conductive layer. For example, the conductive layer 131 may be composed of multiple layers of metal layers including a reflective metal layer and a barrier metal layer. Although not shown in the drawings, the barrier metal layer may cover upper and side surfaces of the reflective metal layer to protect the reflective metal layer. For example, the barrier metal layer may be formed to cover the upper and side surfaces of the reflective metal layer by forming the reflective metal layer, followed by forming the barrier metal layer thereon. For example, the reflective metal layer may be formed by depositing and patterning Ag, Ag alloy, Ni/Ag, NiZn/Ag, or TiO/Ag layers. On the other hand, the barrier metal layer may be formed of Ni, Cr, Ti, Pt or a composite layer thereof to prevent diffusion or contamination of metallic materials of the reflective metal layer. In addition, the conductive layer 131 may be formed of a transparent conductive material, such as indium tin oxide (ITO) or ZnO. ITO is composed of a metal oxide having high light transmittance, and suppresses absorption of light by the conductive layer 131, thereby improving luminous efficacy.

The reflective insulation layer 133 covers the mesa 130 and the exposed lower semiconductor layer 123. In addition, the reflective insulation layer 133 may cover the conductive layer 131. The reflective insulation layer 133 has a stacked structure in which first and second material layers having different indices of refraction are alternately stacked, and reflects light emitted from the active layer 125 toward the substrate 121. Details of the reflective insulation layer 133 will be described below with reference to FIG. 24 to FIG. 26C.

The reflective insulation layer 133 covers a portion of the lower semiconductor layer 123 exposed in the opening 130a. In addition, the reflective insulation layer 133 has an opening 133a which exposes the lower semiconductor layer 123 exposed at the bottom of the opening 130a. A first contact region 123a of the lower semiconductor layer 123 is defined by the opening 133a.

In addition, the reflective insulation layer 133 includes at least one opening 133b formed on the upper semiconductor layer 127. The upper semiconductor layer 127 or the conductive layer 131 is exposed through the opening 133b. As shown in the drawings, a plurality of openings 133b may be arranged in an island shape, but is not limited thereto. Alternatively, the reflective insulation layer 133 may include plural openings having other shapes, or a single opening 133b having a large size.

The reflective insulation layer 133 extends from an upper region of the mesa 130, that is, from an upper region of the upper semiconductor layer 127, to an edge region of the lower semiconductor layer 123 to cover the lower semiconductor layer 123 around the mesa 130. However, a portion of the edge region of the lower semiconductor layer 123 around the mesa 130 may be exposed instead of being covered by the reflective insulation layer 133.

The reflective insulation layer 133 may be deposited by a deposition technique such as electron beam evaporation, and then patterned by photolithography and etching. The thickness of the reflective insulation layer 133 is controlled for reflective performance and the patterning process.

Side surfaces of the reflective insulation layer 133 formed by the patterning process, for example, sidewalls of the openings 133a, 133b and the side surface of the reflective insulation layer 133 on the edge region of the lower semiconductor layer 123, are inclined with respect to the lower semiconductor layer 123. This structure will be described in more detail with reference to FIG. 23.

The first electrode layer 135 and the second electrode layer 137 are disposed on the reflective insulation layer 133. The first electrode layer 135 and the second electrode layer 137 may be formed of the same material and may be formed together by the same process. For example, the first electrode layer 135 and the second electrode layer 137 may be formed by the same process using a lift-off process. However, it should be understood that other implementations are also possible. Alternatively, the first electrode layer 135 and the second electrode layer 137 may be formed of the same material or different materials by separate processes. The layer structure and material of each of the first electrode layer 135 and the second electrode layer 137 will be described in more detail with reference to FIG. 27.

In addition, the first electrode layer 135 is formed on most regions except for the second electrode layer 137 and contacts the first contact region 123a of the lower semiconductor layer 123 exposed through the openings 133a of the reflective insulation layer 133. The first contact region 123a extends into the mesa 130 to spread current in the lower semiconductor layer 123.

The first electrode layer 135 also contacts the lower semiconductor layer 123 in the edge region of the lower semiconductor layer 123 around the mesa 130. The region in which the first electrode layer 135 contacts the edge of the lower semiconductor layer 123 is a second contact region 123b. The second contact region 123b may be disposed around the mesa 130 to surround the mesa 130. Since the second contact region 123b surrounds the mesa 130 along the edge of the lower semiconductor layer 123, electric current can be spread over a wide range on the lower semiconductor layer 123. In addition, as shown in FIG. 21, the first contact region 123a may be connected to the second contact region 123b, or may be separated therefrom. The first electrode layer 135 is electrically insulated from the upper semiconductor layer 127 and the active layer 125 and from the conductive layer 131 by the reflective insulation layer 133.

The second electrode layer 137 is disposed on the upper semiconductor layer 127 or the conductive layer 131. The second electrode layer 137 may be disposed only on the mesa 130, but is not limited thereto. In addition, as shown in the drawings, the second electrode layer 137 may be surrounded by the first electrode layer 135, but is not limited thereto.

The second electrode layer 137 is electrically connected to the upper semiconductor layer 127 through the openings 133b. For example, the second electrode layer 137 may be connected to the conductive layer 131 through the openings 133b to be electrically connected to the upper semiconductor layer 127. To this end, the second electrode layer 137 covers the openings 133b.

The upper insulation layer 139 may be disposed on the first electrode layer 135 and the second electrode layer 137 and may cover the second contact region 123b. The upper insulation layer 139 has an opening 139a which exposes the first electrode layer 135 and an opening 139b which exposes the second electrode layer 137. The first electrode pad region 143a and the second electrode pad region 143b are defined by the openings 139a, 139b.

The first electrode pad region 143a and the second electrode pad region 143b may be bonded to a printed circuit board via a conductive adhesive such as a solder paste. The first electrode pad region 143a and the second electrode pad region 143b may be separated a sufficient distance, for example, about 300 μm, from each other to prevent short circuiting of the conductive adhesive such as a solder paste.

The upper insulation layer 139 may be an oxide insulation layer or a nitride insulation layer, or may be formed of a polymer such as polyimide, Teflon, or parylene. The uppermost layer of each of the first electrode layer 135 and the second electrode layer 137 may be a Ti layer to improve adhesion of the upper insulation layer 139 to the first electrode layer 135 and the second electrode layer 137.

Figure 23:
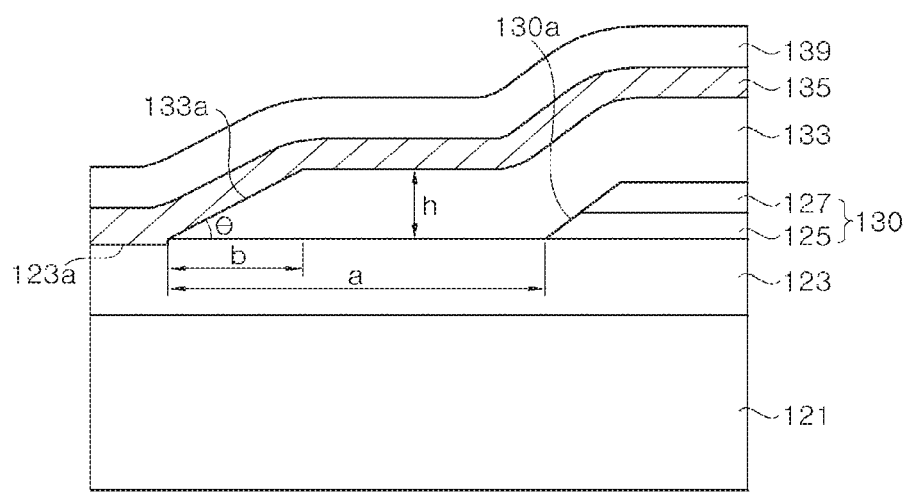
FIG. 23 is a partially enlarged cross-sectional view of FIG. 22.

FIG. 23 is an enlarged cross-sectional view of the first contact region 123a in the opening 130a and sidewalls of the opening shown in FIG. 21 and FIG. 22.

Referring to FIG. 23, the reflective insulation layer 133 covers a portion of the lower semiconductor layer 123 inside the opening 130a when covering the mesa 130. Thus, the first contact region 123a is separated a distance "a" from the sidewall of the opening 130a, that is, the mesa 130. Here, the distance "a" is closer to the mesa 130 in order to secure the first contact region 123a. However, if the distance "a" is too close to the mesa 130, the mesa 130 can be damaged due to process failure. Thus, it is necessary for the first contact region 123a to be separated a certain distance or more therefrom for process stability. Accordingly, the distance "a" may be 1.5 μm or more in order to secure process margin and may be 10 μm or less in order to secure the first contact region 123a.

The opening 133a of the reflective insulation layer 133 defining the first contact region 123a is formed by photolithography and etching such that the sidewalls of the opening 133a can be obliquely formed by photolithography and etching. The surface of the lower semiconductor layer 123 exposed during etching of the reflective insulation layer 133 can be damaged. Thus, the damaged surface of the lower semiconductor layer 123 can be removed by dry etching, whereby the first contact region 123a can be slightly lower than the surface of the lower semiconductor layer 123 under the reflective insulation layer 133, as shown in FIG. 23.

When an angle of the sidewall of the opening 133a with respect to the lower semiconductor layer 123 is θ and the thickness of the reflective insulation layer 133 is h, the angle θ satisfies the following Equation 1.

$$\tan^{-1}(2h/a) \leq \theta \leq 55°. \quad \text{(equation 1)}$$

If θ is greater than 55°, the first electrode layer 135 is likely to be broken (see FIG. 29). On the other hand, in FIG. 23, b represents the distance when the sidewall of the opening 133a is projected onto the lower semiconductor layer 12. $\tan^{-1}(2h/a)$ represents θ when b is half of a. That is, if θ is less than $\tan^{-1}(2h/a)$, the area occupied by the sidewall of the opening 133a excessively increases.

As will be described below, the reflective insulation layer 133 exhibits good reflectance when having a designed thickness. However, since the sidewall of the opening 133a is formed to have a smaller thickness than the designed thickness of the reflective insulation layer 133, the sidewall of the opening 133a has relatively low reflectance. If a portion having low reflectance occupies more than ½ of a, it is difficult to secure reflectivity of the reflective insulation layer 133.

Furthermore, when the conductive layer 131 is composed of a metal layer, the area reflected by the reflective insulation layer 133 is relatively reduced. Accordingly, since the ratio of the sidewall of the opening 133a of the reflective insulation layer 133 to a reflective portion of the reflective insulation layer 133 is increased, it is necessary to reduce the sidewall having low reflectance.

The inclination conditions according to Equation 1 are not limited to the opening 133a, and are also applied to the side surfaces of the reflective insulation layer 133 disposed on the lower semiconductor layer 123 around the mesa 130, and thus detailed description thereof will be omitted.

Figure 24:
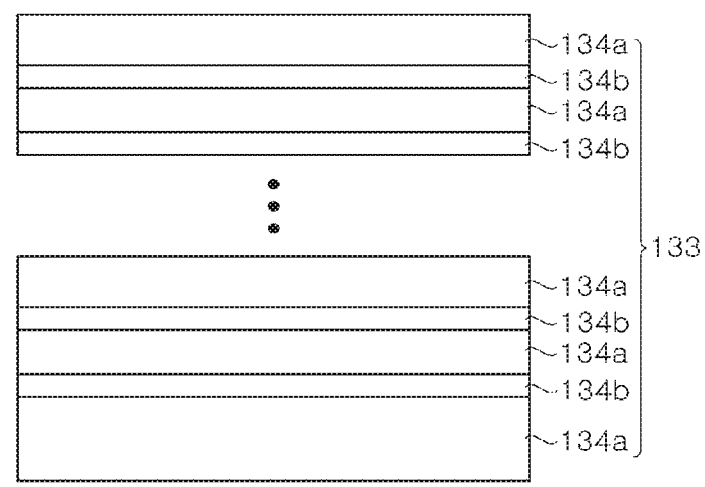
FIG. 24 is a cross-sectional view of a reflective insulation layer according to one exemplary embodiment of the present disclosure.

FIG. 24 is a schematic cross-sectional view of the reflective insulation layer 133.

Referring to FIG. 24, the reflective insulation layer 133 has a stacked structure in which a first material layer 134a and a second material layer 134b having different indices of refraction are alternately stacked one above another. For example, the first material layer 134a may be a $SiO_2$ layer and the second material layer 134b may be a $TiO_2$ layer.

On the other hand, each of the uppermost layer and the lowermost layer of the reflective insulation layer 133 may be the first material layer, for example, a $SiO_2$ layer. The lowermost layer may be formed to a relatively high thickness in order to improve adhesion of the reflective insulation layer 133 with respect to the mesa 130 and the lower semiconductor layer 123, and the lowermost layer may be formed to a relatively high thickness in order to improve adhesion of the first electrode layer 135 with respect to the reflective insulation layer 133.

A thickness of each of the first material layers 133a and the second material layers 133b is set to provide high reflectance within a relatively broad wavelength range. For example, the reflective insulation layer 133 may have a high reflectance of about 90% or more within the wavelength range of about 400 nm to about 700 nm. The reflective insulation layer 133 has high reflectance with respect to light generated from the active layer 125, and can also have high reflectance with respect to visible light introduced from the outside, for example, green light or red light generated through wavelength conversion of phosphors.

Figure 25:
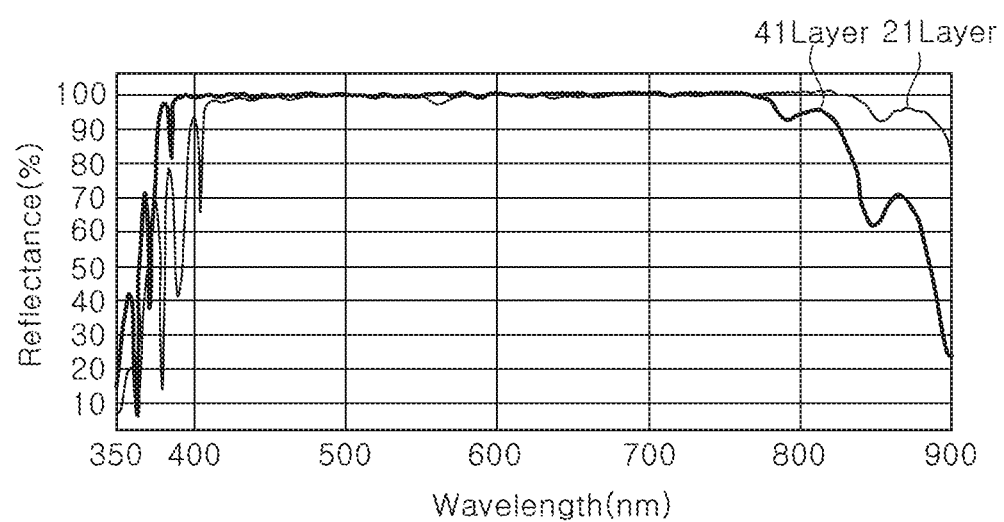
FIG. 25 shows graphs depicting reflectance of reflective insulation layers composed of 21 layers and 41 layers, respectively, depending upon wavelength.

FIG. 25 shows a graph depicting reflectance of a reflective insulation layer composed of 41 layers and reflectance of a reflective insulation layer composed of 21 layers depending upon wavelength.

Referring to FIG. 25, it can be seen that the reflective insulation layer composed of 41 layers exhibits a high reflectance of about 100% in the broad wavelength range of about 390 nm to about 780 nm. On the other hand, the reflective insulation layer composed of 21 layers exhibits a high reflectance of about 95% or more in a broad wavelength range of about 420 nm to about 800 nm, and exhibits a reflectance of about 100% in most regions within this range.

It can be seen that the reflective insulation layer composed of 41 layers has better reflectance than the reflective insulation layer composed of 21 layers. However, since the reflective insulation layer composed of 41 layers has a thickness of about 3.8 µm, it is difficult to perform patterning of the reflective insulation layer through photolithography and etching. The photoresist is likely to be damaged during etching, and when the photoresist has a large thickness, it is difficult to pattern the reflective insulation layer 133 such that the side surface of the reflective insulation layer can have a good inclination angle.

Considering patterning of the reflective insulation layer 133, the reflective insulation layer may have a thickness of about 2.5 µm or less, specifically 2 µm or less. In addition, in order to maintain good reflectance, the reflective insulation layer 133 may have a thickness of 1 µm or more, specifically 1.5 µm or more.

Figure 26A:
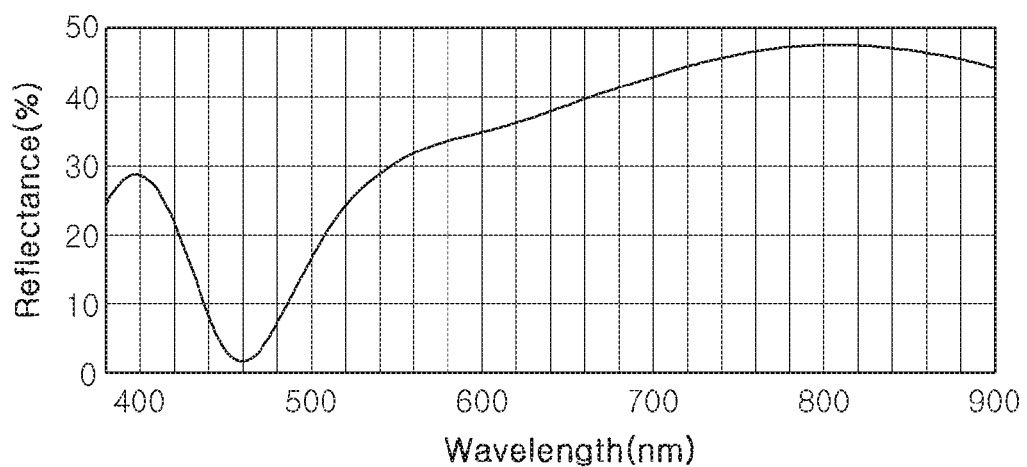
FIG. 26A, FIG. 26B, and FIG. 26C show graphs depicting reflectance of reflective insulation layers composed of 5 layers, 10 layers and 15 layers, respectively, depending upon wavelength.
Figure 26B:
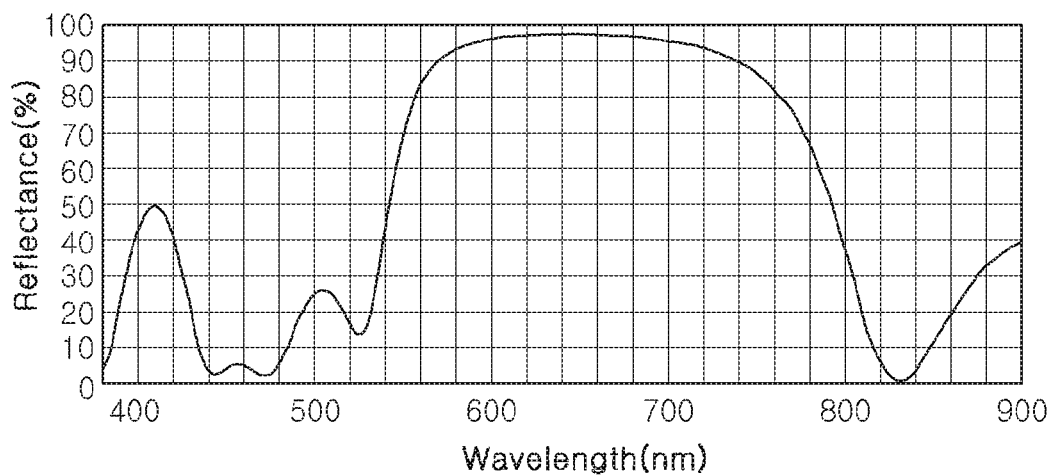
Figure 26C:
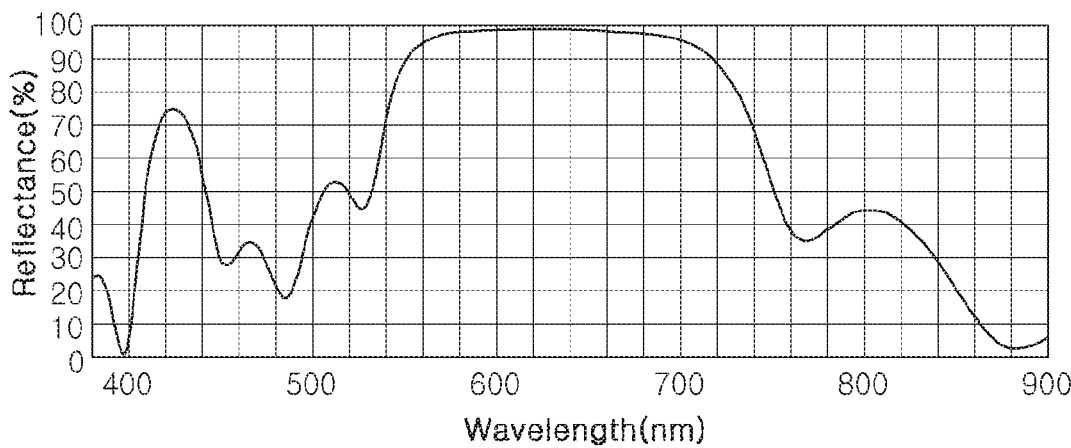

FIGS. 26A, 26B, and 26C are graphs depicting reflectance of reflective insulation layers composed of 5 layers, 10 layers, and 15 layers depending upon wavelength, respectively.

Referring to FIGS. 26A, 26B, and 26C, it can be seen that the reflectance varies depending upon the number of layers constituting the reflective insulation layer and a reflective insulation layer composed of 15 layers or less does not provide good reflectance.

Thus, the reflective insulation layer 133 is required to have at least 216 layers, i.e., a stacked structure of at least 8 pairs of first material layers and second material layers. On the other hand, the reflective insulation layer 133 is required to have a small thickness in consideration of the patterning process, and thus, the reflective insulation layer 133 may be composed of 11 pairs or less, specifically 21 layers or less, as can be seen from FIG. 25.

In addition, even when the reflective insulation layer 133 is formed in a sufficiently stacked structure, the side surface of the reflective insulation layer 133 does not have the sufficiently stacked structure, as shown in FIG. 23, and has a surface damaged by etching. Thus, the reflective insulation layer 133 exhibit significantly low reflectance at the side surface thereof. Therefore, it is necessary to reduce the area occupied by the side surfaces of the reflective insulation layer 133 by adjusting the inclination of the side surface thereof.

Figure 27:
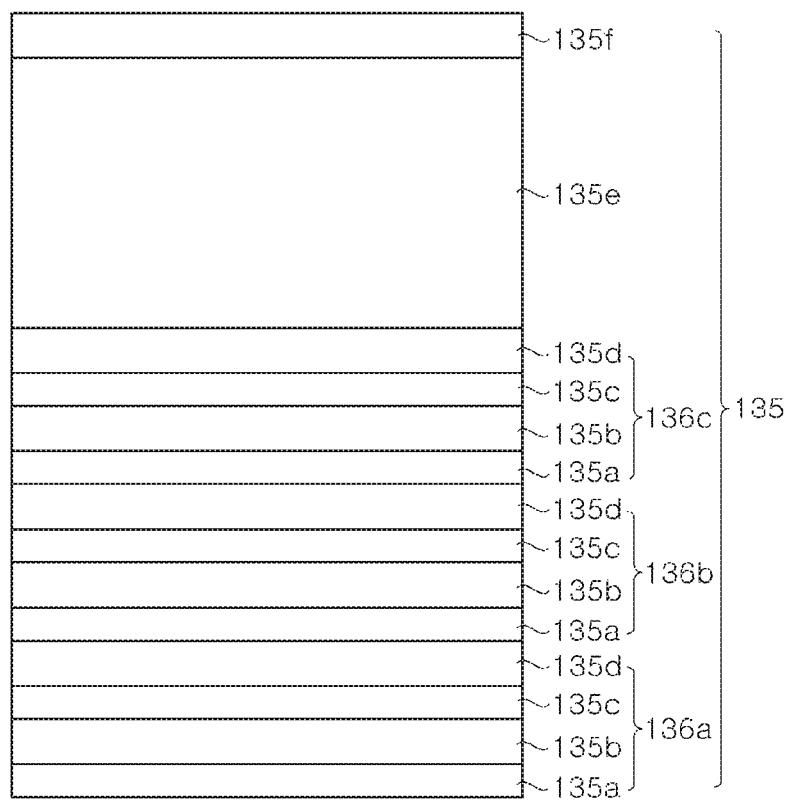
FIG. 27 is a cross-sectional view of an electrode layer according to one exemplary embodiment of the present disclosure.

FIG. 27 is a cross-sectional view of an electrode layer according to one exemplary embodiment of the present disclosure.

Referring to FIG. 27, each of the first electrode layer 135 and the second electrode layer 137 may include a bonding layer 135a, a metal reflection layer 135b, anti-diffusion layers 135c, 135d, and an anti-oxidation layer 135e. The bonding layer 135a is the lowermost layer of the first electrode layer 135 and may form ohmic contact with the lower semiconductor layer 123. For example, the bonding layer 135a may be formed of Ti, Cr, Ni, or the like. The metal reflection layer 135b reflects light entering the first electrode layer 135 to increase reflectance of the light emitting diode. The metal reflection layer 135b may be formed of Al. In addition, the anti-diffusion layers 135c, 135d protect the metal reflection layer 135b by preventing diffusion of metal elements. Particularly, the anti-diffusion layers 135c, 135d can prevent diffusion of metal elements such as Sn in a solder paste. The anti-diffusion layers 135c, 135d may include Cr, Ti, Ni, Mo, TiW, W, or a combination thereof. Although FIG. 27 shows the anti-diffusion layers 135c, 135d as being composed of two layers, it should be understood that other implementations are also possible. Alternatively, the anti-diffusion layer may be composed of a single layer or three or more layers. For example, the anti-diffusion layer may be composed of a single layer using Mo, TiW or W. In addition, the anti-diffusion layer may be composed of pairs of layers using Cr, Ti, or Ni. Particularly, the anti-diffusion layer may include at least 21 pairs of Ti/Ni or Ti/Cr layers. On the other hand, the anti-oxidation layer 135e is formed to prevent oxidation of the anti-diffusion layers 135c, 135d and may include Au. The Au layer acts as a bonding layer by the solder paste.

Each of the first electrode layer 135 and the second electrode layer 137 may further include a bonding layer 135f disposed on the anti-oxidation layer 135e. The bonding layer may comprise Ti, Cr, Ni or Ta. The bonding layer 135f may be used to improve adhesion between each of the first and second electrode layers 135, 137 and the upper insulation layer 139.

As shown in FIG. 27, the bonding layer 135a, the metal reflection layer 135b and the anti-diffusion layers 135c, 135d may be repeatedly stacked under the anti-oxidation layer 135e. FIG. 27 shows the structure wherein these layers 136a are stacked three times to form a lower layer structure 136a, a meddle layer structure 136b and an upper layer structure 136c, thereby providing the first and second electrode layers 135, 137 having high reflectance and stability with respect to solders such as Sn solder. For example, the first and second electrode layers 137, 139 may have a multilayer structure of Cr/Al/Ni/Ti/Cr/Al/Ni/Ti/Cr/Al/Ni/Ti/Au/Ti. Although FIG. 27 shows the structure wherein the same layers are repeated, it should be understood that other implementations are also possible. Alternatively, other material layers may be stacked and the number of layers may be adjusted.

Figure 28A:
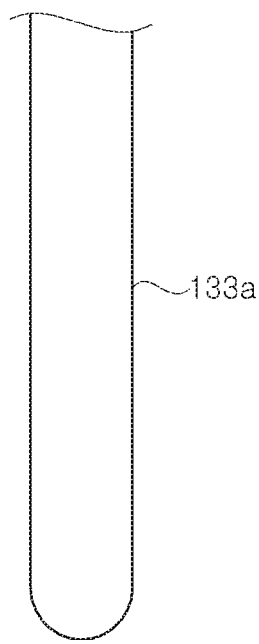
FIG. 28A is a schematic view of an opening of a reflective insulation layer of a light emitting diode according to the conventional (related) art.
Figure 28B:
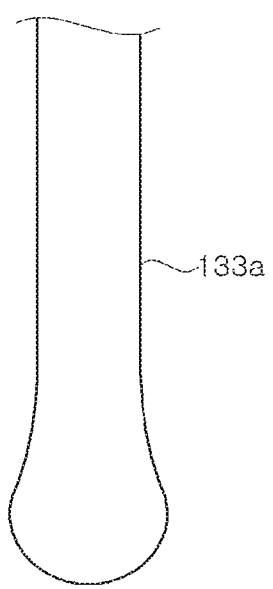
FIG. 28B is a schematic view of an opening of a reflective insulation layer of a light emitting diode according to particular exemplary embodiments of the present disclosure.
Figure 29A:
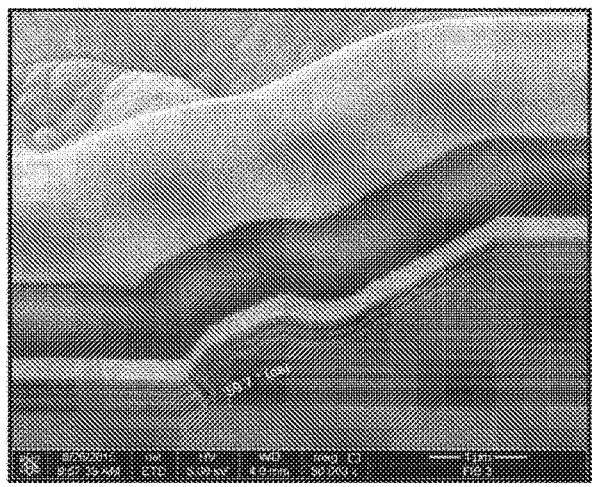
FIG. 29A and FIG. 29B show pictures of an electrode layer formed on the opening of FIG. 28A and FIG. 28B, respectively.
Figure 29B:
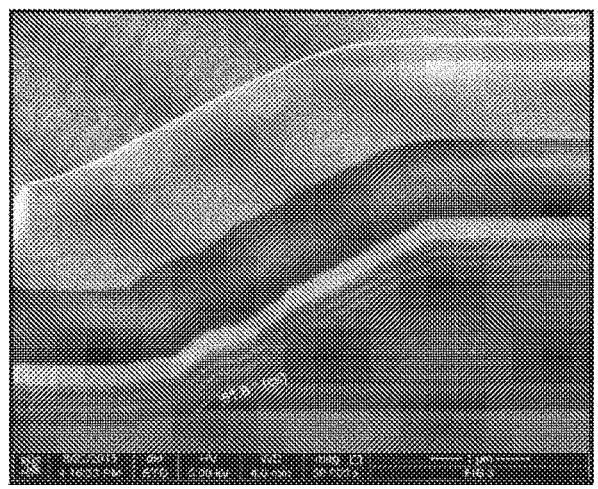

FIGS. 28A and 28B are schematic views of openings 133a of a reflective insulation layer 133 of a light emitting diode according to a particular exemplary embodiment of the present disclosure, and FIGS. 29A and 29B show pictures of electrode layers formed on the openings 133a of FIGS. 28A and 28B. Specifically, FIG. 28A shows a conventional mask pattern for the opening 133*a* of the reflective insulation layer 133 in the related art and FIG. 28B shows a mask pattern for the opening 133*a* of the reflective insulation layer 133 according to a particular exemplary embodiment.

Referring to FIG. 28A, the conventional mask pattern for the opening 133*a* of the reflective insulation layer 133 has an elongated shape with a rounded distal end. Conversely, the mask pattern of the opening 133*a* of the reflective insulation layer 133 according to the particular exemplary embodiment has a rounded distal end with an enlarged width, as shown in FIG. 28B.

Referring to FIG. 29A, when the opening 133*a* of the reflective insulation layer 133 is formed using the conventional mask pattern, a severe double step is formed on the sidewall of the reflective insulation layer 133 and the inclination angle of the reflective insulation layer 133 to the lower semiconductor layer 123 increases, as shown in FIG. 29A. The inclination angle is 59.7°, thereby causing breakage of the first electrode layer 135, as shown in FIG. 29A.

Conversely, when the opening 133*a* of the reflective insulation layer 133 is formed using the mask pattern according to the exemplary embodiment, the inclination angle is decreased to 51.8° and the first electrode layer 135 is not broken, as shown in FIG. 29B.

That is, with the mask pattern for the opening 133*a* of the reflective insulation layer 133 as shown in FIG. 28B, the reflective insulation layer 133 can be formed to have a smooth sidewall at the distal end of the opening 133*a*, thereby preventing the first electrode layer 135 from being broken. In addition, with the mask pattern as shown in FIG. 28B, the distal end of opening 133*a* of the reflective insulation layer 133 has a round shape with an enlarged width.

Figure 30:
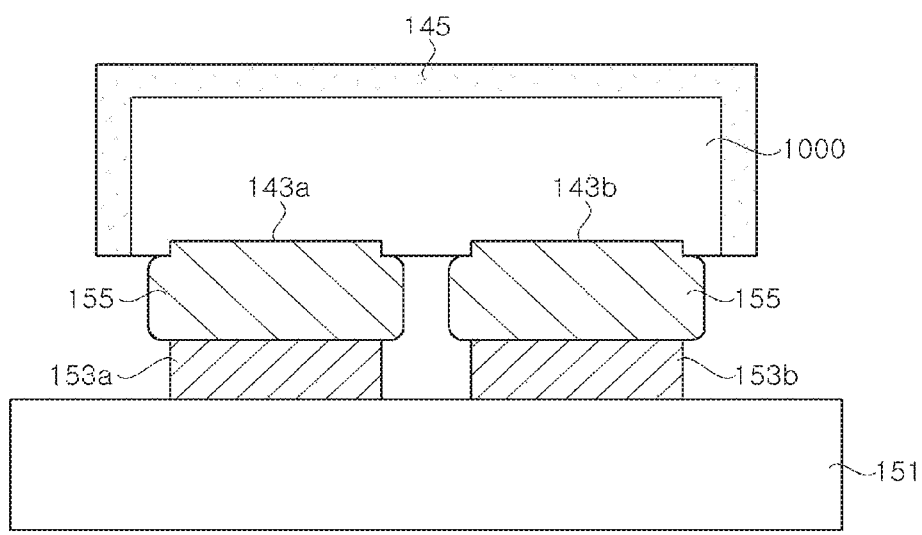
FIG. 30 is a cross-sectional view of a light emitting device module according to one exemplary embodiment of the present disclosure.

FIG. 30 is a cross-sectional view of a light emitting device module according to one exemplary embodiment of the present disclosure.

Referring to FIG. 30, the light emitting device module includes a printed circuit board 151 having pads 153*a*, 153*b* and a light emitting diode 100 bonded to the printed circuit board 151 via a solder paste 155. Here, the light emitting diode is the same as the light emitting diode described with reference to FIG. 21 and FIG. 22.

The printed circuit board is a substrate having a printed circuit formed thereon and is not particularly limited so long as the substrate can provide a light emitting device module.

Conventionally, a light emitting diode is mounted on a printed circuit board on which a lead frame or lead electrodes are formed, and a package, on which such a light emitting diode is mounted, is mounted on the printed circuit board. However, in this exemplary embodiment, the light emitting diode 1000 is directly mounted on the printed circuit board 151 through the solder paste 155.

The light emitting diode 1000 is inverted to have a flip-chip form and mounted on the printed circuit board. The light emitting diode 1000 has a first electrode pad region 143*a* and a second electrode pad region 143*b* for mounting on the printed circuit board. As described with reference to FIG. 21, the first and second electrode pad regions 143*a*, 143*b* are defined by the openings of the upper insulation layer 139 and thus are recessed on one side of the light emitting diode 1000.

A lower surface of the light emitting diode 1000 facing the first and second electrode pad regions 143*a*, 143*b* may be covered by a wavelength converter 145. The wavelength converter 145 may cover not only the lower surface of the light emitting diode 1000 but also a side surface of the light emitting diode 1000.

Figure 31:
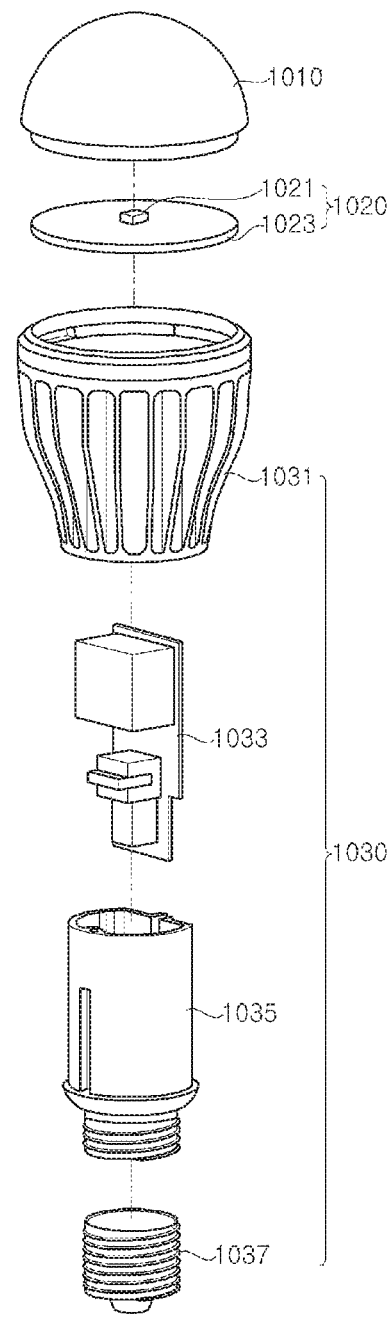
FIG. 31 is an exploded perspective view of a lighting apparatus to which a light emitting diode according to one exemplary embodiment of the present disclosure is applied.

FIG. 31 is an exploded perspective view of a lighting apparatus to which a light emitting diode according to one exemplary embodiment is applied.

Referring to FIG. 31, the lighting apparatus according to this exemplary embodiment includes a diffusive cover 1010, a light emitting module 1020, and a body 1030. The body 1030 may receive the light emitting module 1020 and the diffusive cover 1010 may be disposed on the body 1030 to cover an upper side of the light emitting module 1020.

The body 1030 may have any shape so long as the body can supply electric power to the light emitting module 1020 while receiving and supporting the light emitting module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting module 1020, and may include at least one IC chip. The IC chip may regulate, change or control electric power supplied to the light emitting module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting module 1020 includes a substrate 1023 and a light emitting diode 1021 disposed on the substrate 1023. The light emitting module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 32:
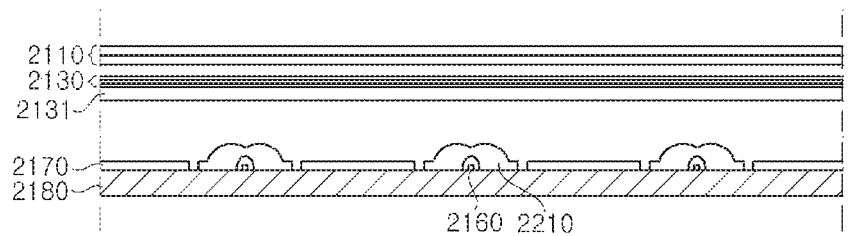
FIG. 32 is a cross-sectional view of one example of a display to which a light emitting diode according to one exemplary embodiment of the present disclosure is applied.

FIG. 32 is a cross-sectional view of one example of a display apparatus to which a light emitting diode according to one exemplary embodiment of the present disclosure is applied.

The display apparatus according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed above the light emitting diode 2160. Light emitted from the light emitting diodes 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to this embodiment.

Figure 33:
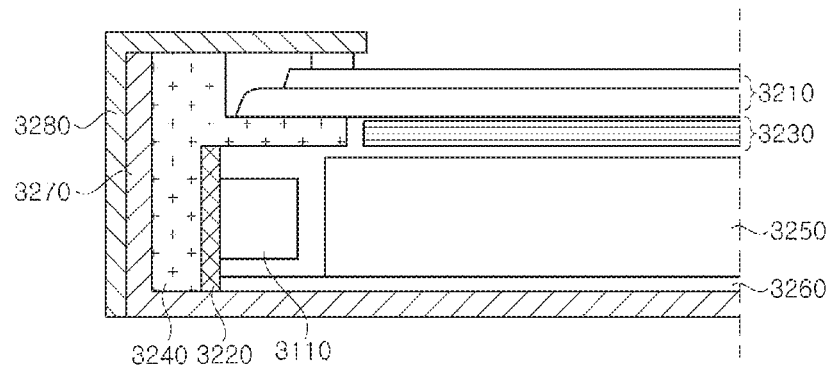
FIG. 33 is a cross-sectional view of another example of a display to which a light emitting diode according to one exemplary embodiment of the present disclosure is applied.

FIG. 33 is a cross-sectional view of another example of the display apparatus to which a light emitting diode according to one exemplary embodiment of the present disclosure is applied.

The display apparatus according to this exemplary embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display apparatus according to this exemplary embodiment.

Figure 34:
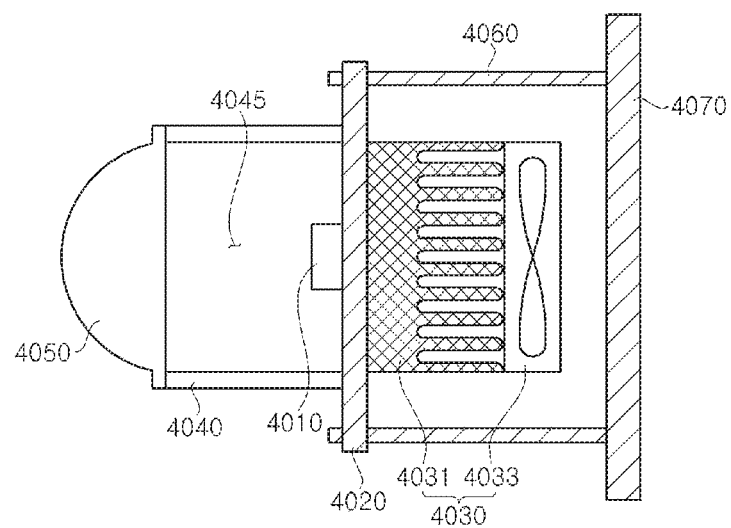
FIG. 34 is a cross-sectional view of a headlight to which a light emitting diode according to one exemplary embodiment of the present disclosure is applied.

FIG. 34 is a cross-sectional view of a headlight to which a light emitting diode according to one exemplary embodiment of the present disclosure is applied.

Referring to FIG. 34, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiment may be applied to headlights, particularly, headlights for vehicles, like the headlight according to this embodiment.

Although some exemplary embodiments have been described herein, it should be understood that various modifications, changes, alterations, and equivalent embodiments can be made by those skilled in the art without departing from the spirit and scope of the present disclosure. For example, although flip-chip type light emitting diodes are illustrated in the above exemplary embodiments and the accompanying drawings, it should be understood that these exemplary embodiments are provided for illustration and the spirit of the present disclosure may also be applied to lateral light emitting diodes, vertical light emitting diodes, or other light emitting diodes. Therefore, the scope of the present disclosure should be interpreted according to the following appended claims and equivalents thereof.

What is claimed is:

1. A light emitting diode comprising:
at least one mesa structure comprising a sequentially stacked arrangement of a first conductivity type semiconductor layer, an active layer, and a second conductivity type semiconductor layer, the mesa structure being partially removed by etching to expose at least part of the first conductivity type semiconductor layer;
a first electrode electrically connected to the exposed first conductivity type semiconductor layer; and
a second electrode disposed on an upper surface of the mesa structure and electrically connected to the second conductivity type semiconductor layer,
wherein:
a mesa exposing portion is formed in at least some region of a periphery of the upper surface of the mesa structure, the mesa exposing portion being not covered by the second electrode and exposing the second conductivity type semiconductor layer, the mesa exposing portion comprising a first mesa exposing portion having a first separation distance between the second electrode and the periphery of the upper surface of the mesa structure and a second mesa exposing portion having a second separation distance therebetween;
the second separation distance is greater than the first separation distance; and
an insulating reflection portion is disposed at least on the second mesa exposing portion.

2. The light emitting diode according to claim 1, wherein the mesa exposing portion further comprises a third mesa exposing portion formed on the upper surface of the mesa structure and surrounded by the second electrode.

3. The light emitting diode according to claim 1, wherein the insulating reflection portion comprises a stacked structure of a first insulating reflection portion for reflecting light in a relatively long wavelength range and a second insulating reflection portion for reflecting light in a relatively short wavelength range.

4. The light emitting diode of claim 1, further comprising: a lower insulation layer disposed under the insulating reflection portion.

5. The light emitting diode of claim 1, wherein the mesa exposing portion is formed in at least some region of a periphery of the light emitting diode.

6. The light emitting diode of claim 1, wherein the first separation distance is a distance between the periphery of the upper surface of the mesa and a reflective electrode-enlarged portion in which the second electrode is enlarged.

7. The light emitting diode of claim 1, wherein the second separation distance is 20 μm or more.

8. The light emitting diode of claim 1, further comprising a first pad and a second pad electrically connecting the first electrode and the second electrode to an external power source, respectively,
wherein:
the first pad and the second pad are electrically connected to the first electrode and the second electrode through a first contact portion and a second contact portion, respectively; and
the second contact portion has a larger area than the first contact portion.

9. The light emitting diode of claim 1, further comprising a second electrode connection pad electrically connected to the second electrode,
wherein the first electrode is electrically insulated from the second electrode connection pad by an upper insulation layer.

10. A light emitting diode package including the light emitting diode of claim 3, the light emitting diode package further comprising a wavelength conversion layer configured to convert wavelengths of light having passed through the substrate.

11. The light emitting diode of claim 10, wherein the light emitting diode is a blue light emitting diode and the wavelength conversion layer comprises at least one of blue, green, and red phosphors.

12. The light emitting diode of claim 4, wherein the lower insulation layer comprises a first opening and a second opening, and the first electrode and the second electrode are formed on the first opening and the second opening, respectively.

13. A method of manufacturing the light emitting diode of claim 12, wherein the first opening and the second opening are formed by different processes.

14. The light emitting diode of claim 6, wherein the reflective electrode-enlarged portion is formed near a vertex of the light emitting diode.

15. The light emitting diode of claim 9, wherein the first electrode and the second electrode connection pad are formed by the same process.

16. A light emitting diode package comprising a light emitting diode and a wavelength conversion layer,
wherein:
the light emitting diode comprises:
a reflective electrode reflecting light generated from an active layer towards a transparent substrate; and
an insulating reflection portion formed in a region of an upper surface of a mesa not covered by the reflective electrode;
the insulating reflection portion comprises:
a first insulating reflection portion configured to reflect light subjected to wavelength conversion by the wavelength conversion layer; and
a second insulating reflection portion configured to reflect light generated from the active layer; and
the light subjected to wavelength conversion by the wavelength conversion layer has a longer wavelength than the light generated from the active layer.

17. The light emitting diode package of claim 16, wherein the first insulating reflection portion is closer to the transparent substrate than the second insulating reflection portion.

18. A light emitting diode comprising:
a lower semiconductor layer;
an upper semiconductor layer disposed on the lower semiconductor layer;

an active layer interposed between the lower semiconductor layer and the upper semiconductor layer;
a first opening formed through the upper semiconductor layer and the active layer to expose the lower semiconductor layer;
a reflective insulation layer covering the upper semiconductor layer and the lower semiconductor layer and having a second opening formed inside the first opening to define a first contact region of the lower semiconductor layer; and
a first electrode layer disposed on the reflective insulation layer and connected to the first contact region of the lower semiconductor layer,
wherein:
the reflective insulation layer has a stacked structure in which a first material layer having a first index of refraction and a second material layer having a second index of refraction are alternately stacked one above another;
the first contact region is placed on a bottom surface of the first opening; and
an angle θ of a sidewall of the second opening with respect to the lower semiconductor layer satisfies the following Equation 1, in which h indicates a thickness of the reflective insulation layer and a indicates a length of the bottom surface of the first opening from the first contact region to the sidewall of the first opening:

$\tan^{-1}(2h/a) \leq \theta \leq 55°$.                <Equation 1>

19. The light emitting diode of claim 18, wherein the length (a) of the bottom surface of the first opening from the first contact region to the sidewall of the first opening ranges from 1.5 μm to 10 μm and the thickness (t) of the reflective insulation layer ranges from 1 μm to 2.5 μm.

20. The light emitting diode of claim 18, wherein the second opening has an elongated shape and one distal end of the second opening has a round shape with an enlarged width.

21. The light emitting diode of claim 18, further comprising a mesa comprising the upper semiconductor layer and the active layer,
wherein a second contact region is disposed around the mesa along a periphery of the first conductivity type semiconductor layer and the first electrode layer extends around the mesa to be connected to the second contact region.

22. The light emitting diode of claim 18, further comprising a second electrode layer disposed on the reflective insulation layer,
wherein the reflective insulation layer comprises at least one third opening disposed on the upper semiconductor layer and the second electrode layer is electrically connected to the upper semiconductor layer through the third opening.

23. The light emitting diode of claim 18, further comprising a substrate disposed under the lower semiconductor layer.

24. A light emitting device module comprising:
a printed circuit board;
the light emitting diode according to claim 18; and
a solder paste bonding the light emitting diode to the printed circuit board,
wherein the solder paste is connected to the first electrode layer.

25. The light emitting diode of claim 19, wherein the reflective insulation layer comprises 8 to 11 pairs of the first material layers and the second material layers.

26. The light emitting diode of claim 25, wherein the first material layer is an $SiO_2$ layer and the second material layer is a $TiO_2$ layer.

27. The light emitting diode of claim 26, wherein each of the first and last layers of the reflective insulation layer is an $SiO_2$ layer.

28. The light emitting diode of claim 21, wherein the first contact region extends from the second contact region.

29. The light emitting diode of claim 28, wherein a plurality of first contact regions extends from the second contact region.

30. The light emitting diode of claim 22, further comprising a conductive layer interposed between the upper semiconductor layer and the reflective insulation layer to contact the upper semiconductor layer,
wherein the conductive layer is exposed through the third opening and the second electrode layer is connected to the conductive layer through the third opening.

31. The light emitting diode of claim 22, further comprising an upper insulation layer disposed on the first electrode layer and the second electrode layer,
wherein the upper insulation layer has openings exposing the first electrode layer and the second electrode layer to define a first electrode pad region and a second electrode pad region.

32. The light emitting diode of claim 22, wherein the second electrode layer is formed of the same material as the first electrode layer.

33. The light emitting diode of claim 31, wherein each of the first electrode layer and the second electrode layer comprises a Ti layer adjoining the upper insulation layer.

34. The light emitting diode of claim 32, wherein the second electrode layer is surrounded by the first electrode layer.

35. The light emitting diode of claim 32, wherein each of the first electrode layer and the second electrode layer comprises an ohmic contact layer, a metal reflection layer, an anti-diffusion layer, and an anti-oxidation layer.

36. A light emitting diode comprising:
a lower semiconductor layer;
a mesa disposed on the lower semiconductor layer and comprising an upper semiconductor layer and an active layer;
a reflective insulation layer covering the mesa and the lower semiconductor layer around the mesa while exposing a periphery of the lower semiconductor layer; and
a first electrode layer disposed on the reflective insulation layer and contacting the periphery of the lower semiconductor layer around the mesa,
wherein the reflective insulation layer has a stacked structure in which a first material layer having a first index of refraction and a second material layer having a second index of refraction are alternately stacked one above another; and an angle θ of a side surface of the reflective insulation layer with respect to the lower semiconductor layer satisfies the following Equation 1, in which h indicates a thickness of the reflective insulation layer and a indicates a distance from a contact region between the first electrode layer and the periphery of the lower semiconductor layer to a sidewall of the mesa:

$\tan^{-1}(2h/a) \leq \theta \leq 55°$.                <Equation 1>

37. The light emitting diode of claim 36, wherein the distance (a) from the contact region between the first electrode layer and the periphery of the lower semiconductor layer to the sidewall of the mesa ranges from 1.5 μm to 10 μm, and the thickness (t) of the reflective insulation layer ranges from 1 μm to 2.5 μm.

38. The light emitting diode of claim 37, wherein the reflective insulation layer comprises 8 to 11 pairs of the first material layers and the second material layers.

* * * * *